United States Patent
Takahashi et al.

[11] Patent Number: 5,898,621
[45] Date of Patent: Apr. 27, 1999

[54] BATCH ERASABLE SINGLE CHIP NONVOLATILE MEMORY DEVICE AND ERASING METHOD THEREFOR

[75] Inventors: Masahito Takahashi, Kodaira; Michiko Odagiri, Kuroishi; Takeshi Furuno, Koganei; Kazunori Furusawa; Masashi Wada, both of Kodaira, all of Japan

[73] Assignees: Hitachi, Ltd.; Hitachi ULSI Engineering Corp., both of Tokyo; Hitachi Tohbu Semiconductor, Ltd., Saitama, all of Japan

[21] Appl. No.: 08/904,276

[22] Filed: Jul. 31, 1997

Related U.S. Application Data

[63] Continuation of application No. 08/741,938, Oct. 31, 1996, Pat. No. 5,677,868, which is a continuation of application No. 08/445,105, May 19, 1995, Pat. No. 5,598,368.

[30] Foreign Application Priority Data

May 19, 1994 [JP] Japan .................................. 6-129691

[51] Int. Cl.⁶ .................................................. G11C 13/00
[52] U.S. Cl. ............................ 365/185.33; 365/185.28; 365/218
[58] Field of Search ............................ 365/185.33, 218, 365/185.28

[56] References Cited

U.S. PATENT DOCUMENTS

| 4,903,236 | 2/1990 | Nakayama et al. | 365/185 |
| 5,181,188 | 1/1993 | Yamauchi et al. | 365/185 |
| 5,598,368 | 1/1997 | Takahashi | 365/185 |

FOREIGN PATENT DOCUMENTS

| 4-6698 | 1/1992 | Japan . |
| 4-222994 | 8/1992 | Japan . |
| 5-89688 | 4/1993 | Japan . |

*Primary Examiner*—Terrell W. Fears
*Attorney, Agent, or Firm*—Antonelli, Terry, Stout & Kraus, LLP

[57] ABSTRACT

A batch erasable single chip nonvolatile memory device and a method therefor of using the same provided with memory cells which are adapted to execute an erase operation by ejecting an electric charge, accumulated at floating gates by a program operation (including a pre-write operation) carries out, in sequence a first operation for reading memory cells of an erase unit and carrying out a pre-write operation on those nonvolatile memory cells at the floating gates of which electric charge is not stored, a second operation for carrying out a batch erase operation at a high speed for the nonvolatile memory cells of said erase unit with a relatively large energy under a relatively large erase reference voltage, a third operation for carrying out a read operation of said all erased nonvolatile memory cells and a write operation on those nonvolatile memory cells which are adapted to have a relatively low threshold voltage, and a fourth operation for carrying out a batch erase operation at a low speed for the nonvolatile memory cells of said erase unit with a relatively small energy under a relatively small erase reference voltages, or is provided with an automatic erasing circuit for executing these operations.

50 Claims, 13 Drawing Sheets

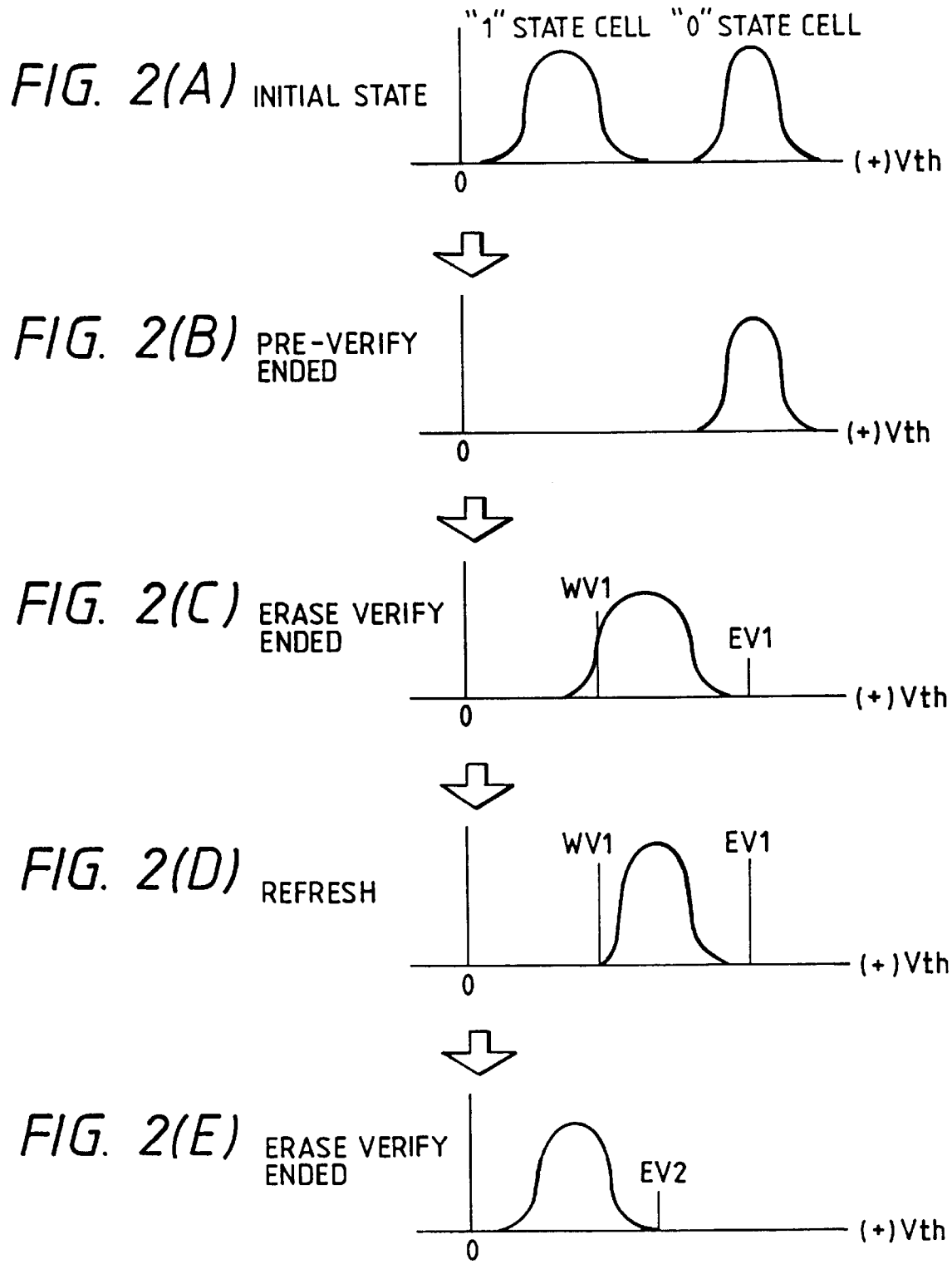

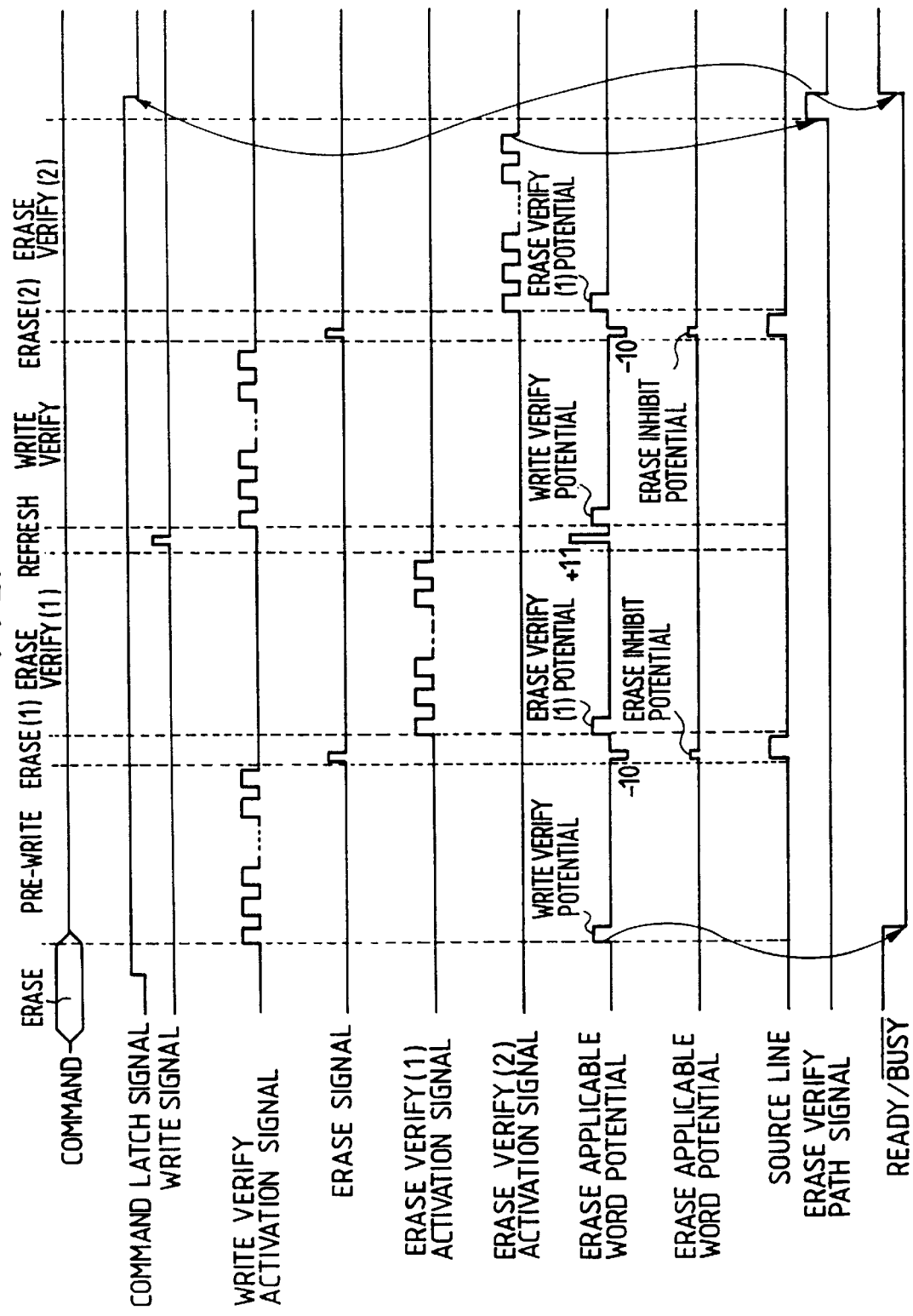

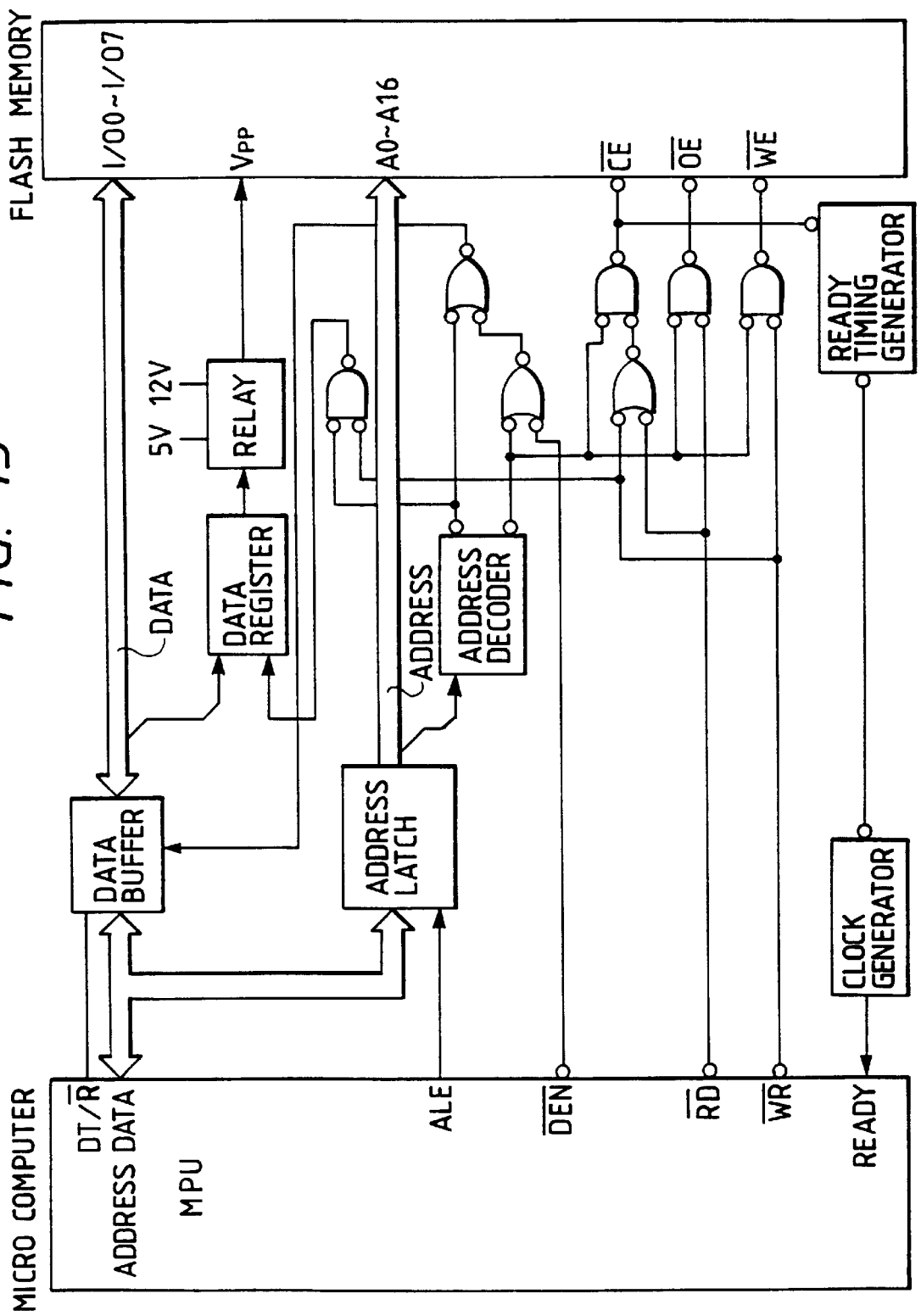

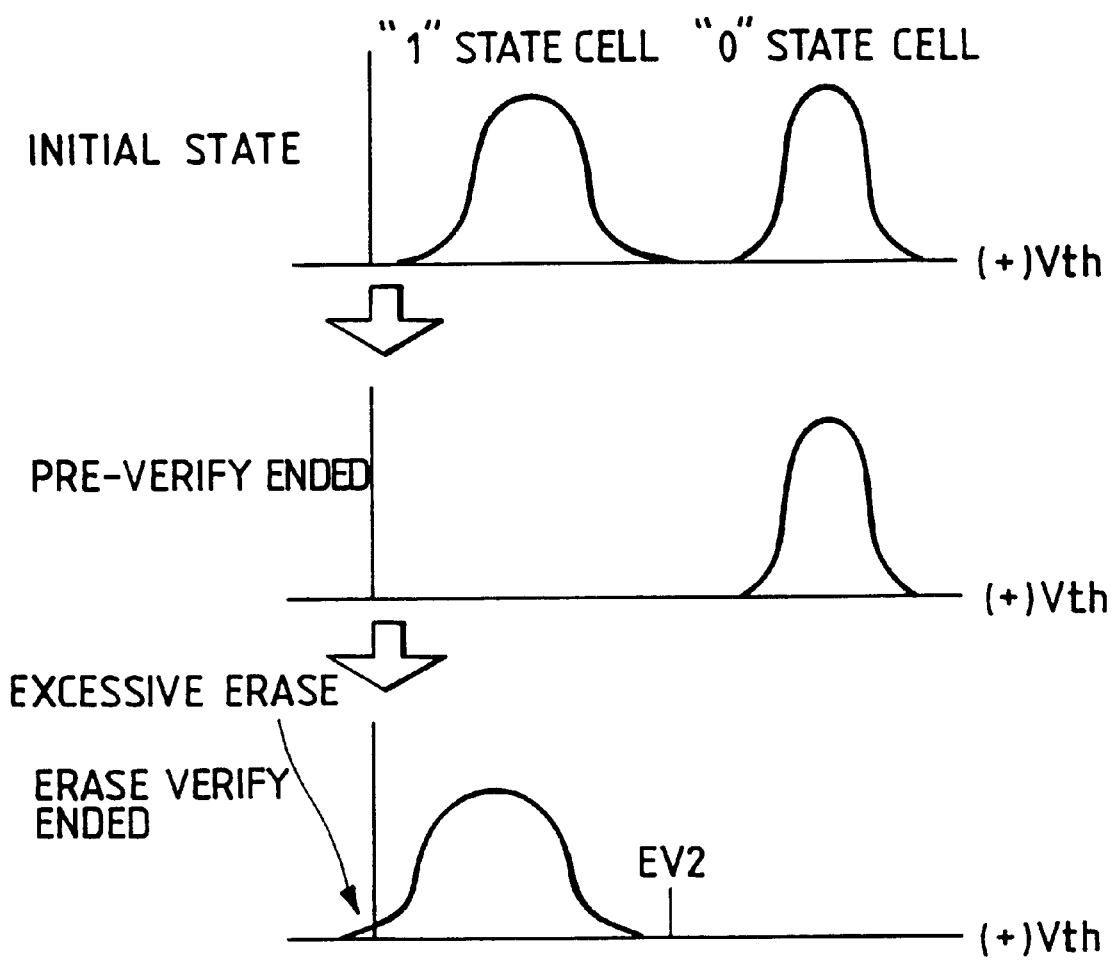

BATCH ERASABLE SINGLE CHIP NONVOLATILE MEMORY DEVICE AND ERASING METHOD THEREFOR

This is a continuation of application Ser. No. 08/741,938, filed Oct. 31, 1996; which now U.S. Pat. No. 5,677,868, in turn, is a continuation of application Ser. No. 08/445,105, filed May 19, 1995, now U.S. Pat. No. 5,598,368.

BACKGROUND OF THE INVENTION

FIELD OF THE INVENTION

The present invention relates to a batch erasable nonvolatile memory devices (hereinafter simply referred to as "flash memory"). a method of erasure therefor (eg., batch erasure) and an apparatus using same.

In a program operation in a flash memory with a power supply voltage Vcc of 5V, hot electrons which are produced near a drain are introduced into a floating gate to obtain a high-level state (logic 0) of a threshold voltage by setting a drain potential of a nonvolatile memory cell (hereinafter simply referred to as "memory cell") to approximately 4V and a potential of a word line to which a control gate is connected to approximately 11V. In an erase operations a tunnel current is generated by setting a source potential to approximately 4V and the word line to approximately –11V and the threshold voltage is set to a low-level state (logic "1") by ejecting a charge stored at the floating gate.

As shown in FIG. 14, in the initial state before aN erase operation, there are a group of memory cells for storing data having threshold voltages corresponding to logic "1" and a group of memory cells for storing data having threshold voltages corresponding to logic "0" and, after selecting the memory cells which have stored logic "1" data by carrying out read operation before erase operation and changing over data of all memory cells to the logic "0" state by carrying out pre-write and pre-verify operations for the memory cells which store "1" data, batch erase and erase verify operations are performed. At this time, some of data is depletively erased (deplete failure) due to variations of the effects resulting from variations of processes such as, for example, increase of a tunnel oxidized film and an impurity profile and internal parasitic resistance of internal potential and variations of a threshold voltage due to batch erases. If there is even one memory cell with such negative threshold voltage, a current flows into the memory cell and a read operation is disabled even though the word line to which this memory cell is connected is not selected. Therefore, various methods have been proposed to prevent the above-described deplete failure by detecting the depletively erased memory cell and rewriting the data. Such preventive measures against the deplete failure are disclosed in Japanese Patent Application Laid-Open Nos. 6698/1992, 222994/1992 and 89688/1993.

SUMMARY OF THE INVENTION

In the above erasing method, a rewrite operation is carried out as a preventive measure for the memory cells in which the deplete failure has occurred. However, there is still a problem that, if the deplete failure occurs in the memory cells, an adverse effect such as decrease of substantial reprogramming frequency (the number of times) due to deterioration of write/erase characteristic and information holding characteristic may be caused. For the flash memory, a low voltage design of a power supply voltage with approximately 3V has been examined and, it is inevitable, for the threshold voltage corresponding to the erase operation to be reduced thereby meeting the requirements of the low power supply voltage and, therefore, there will be a higher possibility for occurence of the deplete failure which will be a large hindrance to implementation of the low power supply voltage design of the flash memory.

An object of the present invention is to provide a batch erasable nonvolatile memory device and an apparatus using the same and an erasing method thereof which enable a high precision erasing operation in a short period of time.

Another object of the present invention is to provide a batch erasable nonvolatile memory device and an apparatus using the same and an erasing method thereof which enable a stable operation with a low voltage.

The above-described and other objects and novel characteristics of the present invention will become apparent from the description of the specification and accompanying drawings thereof.

A representative aspect of the present invention, disclosed in the present application, is briefly described below. Specifically, in a batch erasable nonvolatile memory device provided with memory cells which are adapted to erase data stored in these memory cells by ejecting a charge stored at a floating gate in pre-write operation to a source side, there is provided an automatic erasing circuit which carries out in sequence: a first operation for reading out those memory cells of an erasing unit and pre-writing on nonvolatile memory cells in which the threshold voltage has a low-level state (in which no charge is stored at the floating gate) in a batch erase operation of nonvolatile memory cells; a second operation for carrying out batch erasure of the nonvolatile memory cells of the above erasing unit at a high speed with a relatively large energy under a relatively large erase reference voltage; a third operation for reading out all the above-erased nonvolatile memory cells and pre-writing on those memory cells which are set to a relatively low threshold voltage which is larger than 0V and close to zero; and a fourth operation for carrying out batch erase operation of the nonvolatile memory cells of the above erase unit at a low speed with a relatively small energy under a relatively small erase reference voltage.

According to the above-described means, a threshold voltage in an erase state can be set down to a low voltage in high precision while preventing excessive erase by combining such operation to detect the memory cells which may be depletively erased and pre-write in these memory cells in the above third operation and perform a batch erase operation with less variations and low energy in the above fourth operation.

Another representative aspect of the present invention disclosed in the present application is briefly described below. Specifically, as an erasing method of a batch erasable nonvolatile memory device provided with memory cells which are adapted to erase data stored in these memory cells by ejecting a charge stored at a floating gate in pre-write operation to a source side, there are carried out in sequence: a first operation for reading out those memory cells of an erasing unit and pre-writing on nonvolatile memory cells in which the threshold voltage has a low-level state in a batch erase operation of nonvolatile memory cells; a second operation for carrying out batch erasure of the nonvolatile memory cells of the above erasing unit erase operation at a high speed with a relatively large energy under a relatively large erase reference voltage; a third operation for reading out all the above-erased nonvolatile memory cells and pre-writing on those memory cells which are set to a relatively low threshold voltage which is larger than 0V and close to zero; and a fourth operation for carrying out batch erase operation of the nonvolatile memory cells of the above erase unit at a low speed with a relatively small energy under a relatively small erase reference voltage.

According to the above-described means, a threshold voltage in an erase state can be set down to a low voltage in high precision while preventing excessive erase by combining such operation to detect the memory cells which may be over erased and pre-write in these memory cells in the above third operation and provide a batch erase operation with less variations and low energy in the above fourth operation.

BRIEF DESCRIPTION OF THE DRAWINGS

FIGS. 2(A) to 2(E) are distribution diagrams of a threshold voltage of memory cells at various stages of operation adapted to the erasing method for the flash memory according to the present invention;

FIG. 3 is a schematic timing chart showing an embodiment for describing an outline of erase operation according to the present invention;

FIG. 13 is an connection diagram of signals with an emphasis on a microprocessor CPU and the above-described flash memory; and FIG. 14 is a threshold voltage distribution diagram based on a conventional erasing method.

DESCRIPTION OF THE PREFERRED EMBODIMENTS

Figure 1:
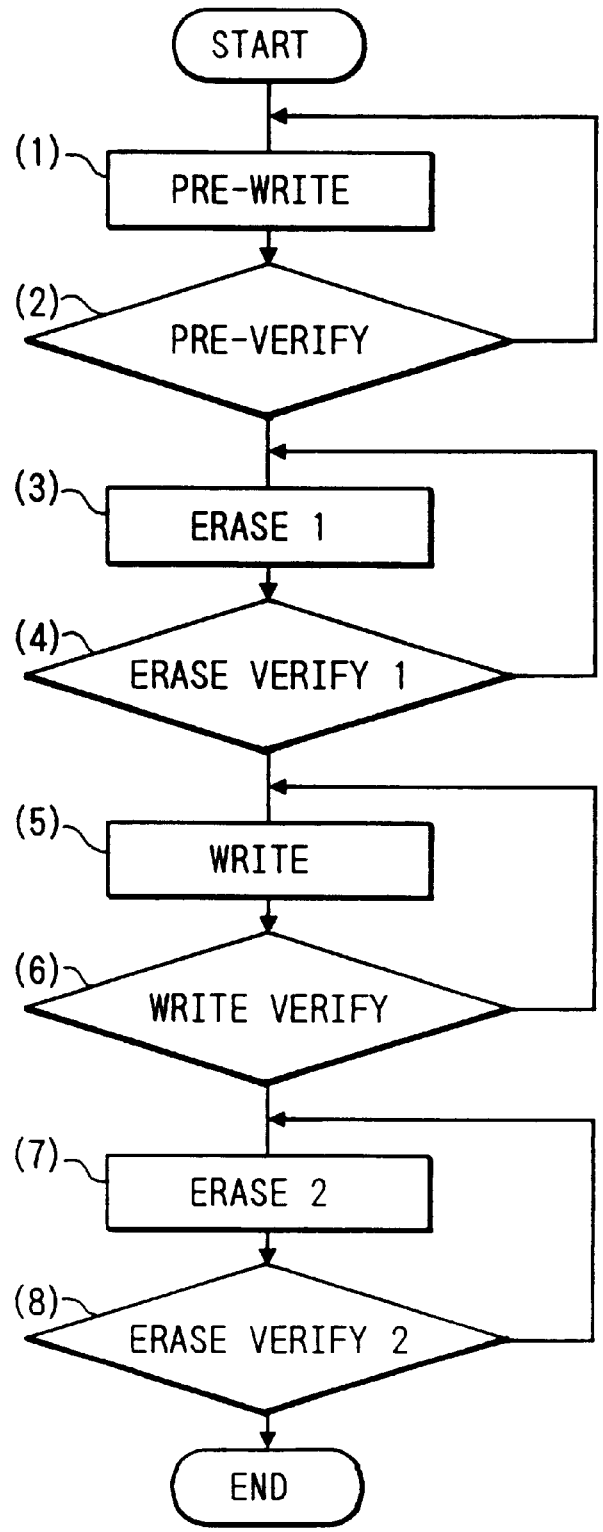
FIG. 1 is a schematic flow chart for illustrating an embodiment of an erasing method for a flash memory according to the present invention.

FIG. 1 shows a schematic flow chart for illustrating an embodiment of a flash memory according to the present invention. FIGS. 2(A) to 2(E) are distribution diagrams of a threshold voltage of a memory cell corresponding thereto. An erasing method according to the present invention is described below, referring to FIGS. 1 and 2.

In FIG. 1, when an erase mode, which is a kind of operation for varying a threshold value of the memory cell, is started, pre-write and pre-verify are carried out in steps (1) and (2). In other words, as shown in FIG. 2(A), there exist a group of memory cells for storing data of logic "0" which are adapted to have a high threshold voltage Vth for pre-write operation and a group of memory cells for storing data of an erase state, that is, logic "1" in a state before erasing (initial state). When the memory cells included in such erase unit are read and a group of memory cells which are adapted to have a low threshold voltage, in other words, set in the erase state (logic "1") are detected by pre-verify in step (2) of FIG. 1, a pre-write operation (injection of electrons into the floating gate) is carried out for such memory cells in step (1).

Though it is indicated in this embodiment that pre-verify is carried out after unconditional pre-write in step (1), actually a memory cell of the leading address returns to step (1) and pre-write is executed for the memory cell in the erase state if an address corresponding to a memory cell for which storage of data in the erase state, that is, logic "1" has been identified by executing pre-verify in step (2) through step (1), is not the final address of the erase unit. As a result of pre-verify in step (2), a memory cell of the following address is pre-verified through (count up or count down) addresses corresponding to the memory cells which have been identified as being in the pre-write state. When (1) pre-write corresponding to the above (2) pre-verify is executed for all memory cells of the erase unit, the operation proceeds to the following step (3). Upon completion of pre-verify as described above, the data of all groups of memory cells of the erase unit are adapted to have a threshold voltage distribution corresponding to logic "0" as shown in FIG. 2(B).

In step (3) shown in FIG. 1, the data of all memory cells corresponding to the above erase unit is batch-erased. This erase operation is executed in a short period of time with a relatively large energy. In other words, a charge is withdrawn (ejected) by setting a source potential to a relatively high voltage of approximately 4V and a word line connected to the control gate to a high voltage such as −11V and generating a tunnel current from the floating gate to the source in an erasing time corresponding to a relatively short pulse width.

In step (4) shown in FIG. 1, the first erase verify is carried out. In the case in which the power supply voltage Vcc is set to 5V, the preset voltage EV1 of approximately 4V corresponding to a relatively high voltage is applied to a word line selected by the X decoder based on the address signals generated from a built-in address generator. In this case, when there is at least one memory cell which has a threshold voltage higher than the preset voltage, the operation returns to step (3) and erase operation of all memory cells is carried out in the above unit of time. The threshold voltages of all groups of memory cells in the erase unit are adapted to remain at 0V or over and in the distribution lower than a relatively high setting voltage EV1 as shown in FIG. 2(C) by repeating such erase operation.

In steps (4) and (5) in FIG. 1, as in the above pre-write and pre-verify, a relatively low preset potential WV1 of 1V to 2V is applied to the word line selected by the X decoder and a memory cell (whose threshold voltage Vth is lower than the preset potential WV1 of the selected memory cell) is selected and pre-write operation is carried out. In other words, in steps (4) and (5), the memory cells may be depletively erased by the following second erase operation and, therefore, the threshold voltage is raised by detecting in advance these memory cells and carrying out a rewrite operation. Differing from an ordinary write operation, pre-write in this step (5) is intended to carry out weak pre-write which does not exceed the above erase voltage EV1 on the memory cells having a threshold voltage Vth lower than the above preset voltage WV1 (4V is applied to the control gate, 0V to the source and 3.8V to the drain). Consequently, as shown in FIG. 2(D), the distribution of the threshold voltage of the group of memory cells of the erase unit can be set within a relatively narrow range which is lower than the above erase voltage EV1 and higher than the above preset voltage WV1.

In step (7) shown in FIG. 1, batch erase is carried out for all memory cells corresponding to the above erase unit. This erase operation is executed with a relatively small energy in a relatively long period of time. In other words, a charge is withdrawn (ejected) by setting a source potential to a relatively low voltage of approximately 3V, as compared with the source potential of 4V in step (3), and a word line connected to the control gate to a high voltage such as −11V and generating a tunnel current from the floating gate to the source in an erasing time.

In step (8) shown in FIG. 1, the second erase verify is carried out. In this case, the preset voltage EV2 of approximately 3.2V corresponding to a relatively low voltage is applied to a word line selected by the X decoder based on the address signals generated from the built-in address generator and, when at least one memory cell is present which has the threshold voltage higher than the preset voltage EV2, the operation returns to step (7) and the erase operation in the above unit of time is carried out. By repeating these operations, the threshold voltage of the group of memory cells for storing all data of logic "1" in the erase unit is adapted to be within a distribution of 0V or over and lower than a relatively high preset voltage EV2 as shown in FIG. 2(E).

Figure 4A:
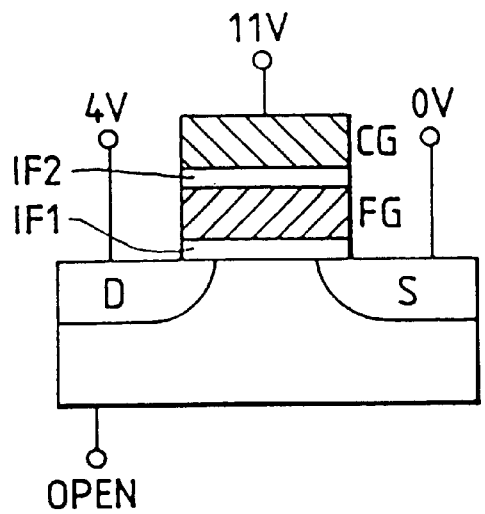
FIGS. 4(A) and 4(B) are schematic cross sectional views showing an embodiment of a memory cell in a pre-write operation and an erase operation to which the present invention is applied, respectively.
Figure 4B:
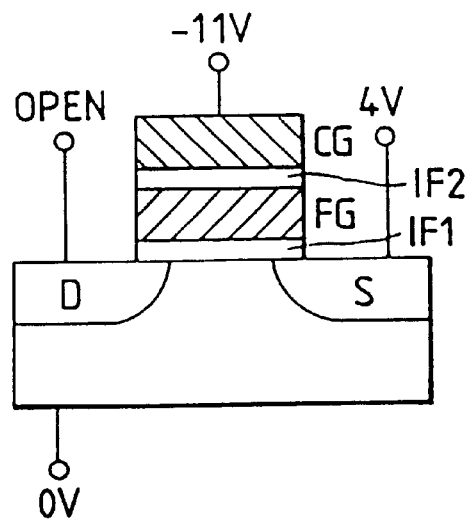

FIGS. 4(A) and 4(B) show schematic cross sectional views of a storage MOSFET (memory cell) for storing information as a value of the threshold voltage. As shown in FIGS. 4(A) and 4(B), the memory cell has a pair of an n-type semiconductor regions, serving as a source area S and a drain area D, formed on a main surface of a p-type semiconductor region (well). A first insulation film IF1 is formed to cover parts of the source area S and the drain region and a channel forming region between the source region S and the drain region D. A floating gate FG is formed on this first insulation film IF1 and a control gate CG is formed on this floating gate FG through a second insulation film IF2. As shown in FIG. 4(A), in a pre-write operation, a high voltage such as 11V is applied to the control gate CG connected to the word lines, a voltage such as 4V is applied to the drain region D to be connected to the bit line, and a voltage such as 0V is applied to the source region. S connected to the source line whereby the well is made open. With this, the memory cells are set in the ON state and hot electrons, produced nearby the drain region, are injected into the floating gate FG through a thin gate insulation film.

As shown in FIG. 4(B), in a erase operation, a negative voltage such as −11V is supplied to the control gate CG connected to the word lines to make the drain region D to be connected to the bit line open, a voltage such as 4V is applied to the source region S connected to the source line, and 0V is applied to the well. Thus, the tunnel current flows through the first insulation film (thin tunnel insulation film) between the floating gate FG and the source region and the charge accumulated at the floating gate FG is withdrawn (ejected) to the source region side.

In such erase operation, when a voltage to be applied to the source region is increased to a high voltage such as, for example, 4V, a tunnel current is produced and high speed erasing can be carried out. On the contrary, if the voltage to be applied to the source region is decreased to a low voltage such as, for example, 3V, the tunnel current is substantially reduced and a pre-write operation is delayed. The time to be spent for withdrawing (ejecting) the same charge as described above when the voltage to be applied to the source area is decreased to 3V is extended equivalent to approximately one digit longer than when the voltage is increased to a high value such as 4V.

Figure 5:
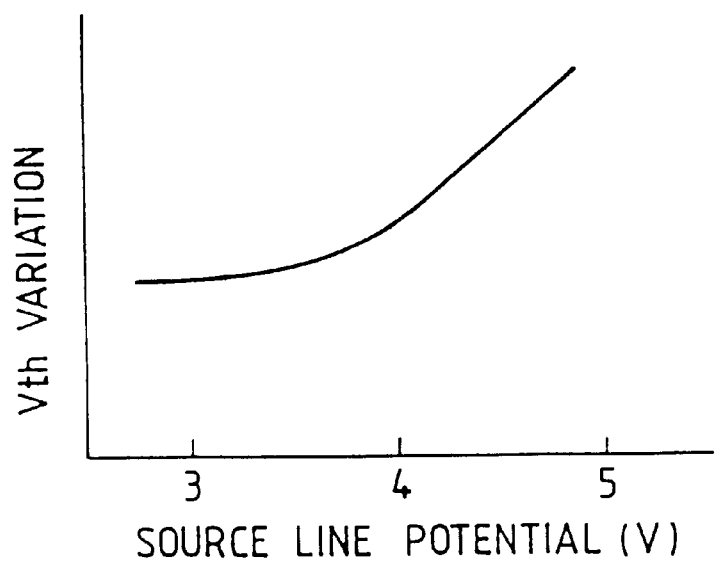
FIG. 5 is an erase characteristic diagram showing a relationship between a source voltage and a threshold voltage Vth of a memory cell to which the present invention applies.

FIG. 5 is a characteristic diagram showing the relationship between a voltage to be applied to the source region is as and the threshold voltage Vth. When the voltage to be applied to the source regions described above, erasing is carried out in a short period of time whereas the threshold voltage Vth of the group of memory cells whose data is erased largely varies. In other words, the distribution of the threshold voltage in the group of memory cells whose data is erased becomes wide. On the contrary, when the source voltage is lowered to, for example, 3V, the erasing time is extremely extended whereas the variations of the threshold voltage Vth become small. The distribution of the threshold voltage in the erased memory cell group can be restricted to a small range.

In this embodiment, the source voltage for the first erase operation is set as a relatively high voltage such as approximately 4V by utilizing that the time of verify (pre-verify) and pre-write operations is as short as negligible as compared with the time required in erase operation and the relationship of variations of the source voltage and the threshold voltage Vth in erase operation as described above, and erase operation is carried out with a relatively high preset voltage EV1 in view of the variations of the Vth under such source voltage, and the threshold voltage Vth is shifted to be low in a short period of time in the range where the memory cells are not depletively erased, with the threshold voltage Vth of the group of memory cells. After this, the threshold voltage Vth which has been excessively decreased by the above high speed erase operation is detected with the preset voltage WV1 and rewrite is carried out The second erase operation is carried out by setting the voltage to be applied to the source area to be low as 3V and spending a relatively long period of time in erase operation in which the above voltage is a relatively small preset voltage EV2. An erase operation for obtaining a low threshold voltage Vth can be carried out while preventing the memory cells from being depletively erased by such second erase operation.

The threshold voltage of the group of memory cells to be erased by the first erase operation is shifted to be low as a whole in the second erase operation and, since the volume to be erased is small even though the source voltage is lowered as described above, the erasing time of the whole can be reduced in operation up to step (1) to (6).

For example, there is a flash memory in which erase operation is carried out in a unit of word line. If one word line includes approximately 2K memory cells (2048 bits), the data stored in these memory cells can be erased within approximately 10 ms. The time percentage to be shared is such that approximately 8 ms is spent in the second erase operation in steps (7) and (8) shown in FIG. 1, approximately 1 to 2 ms as much as one digit shorter than the above is spent in the first erase operation in steps (3) and (4) and a time less than 1 ms is spent in steps (1) and (2) and steps (5) and (6). Though the group of memory cells after pre-write as described above can be erased as shown in FIG. 2(E) only by one erase operation in steps (7) and (8), the time required in this process is approximately 100 ms or over and such erase operation can never be practical.

FIG. 3 shows a schematic timing chart of an embodiment for illustrating the outline of erase operation according to the present invention. The time axis of this timing chart is shown compressed at the portions for erase and rewrite to indicate the whole operation sequence. FIG. 3 shows a concept of the whole erase sequence corresponding to the schematic flow chart shown in FIG. 1 and does not faithfully correspond to an actual erase sequence.

An erase command for executing the erase operation, which is a kind of operation for changing the threshold voltage of the memory cells is fetched from an external terminal I/O, to be described later, into the command decoder according to the rise of the command latch signal.

For pre-write operation, the memory cells are selected in sequence according to a write verify activating signal and pre-write is carried out for the memory cells which have been erased after the potential of the word line to be erased has been raised. At this time, a Ready/Busy signal, which indicates that an erase operation is being carried out in the auto control circuit of the flash memory, changes from a high level to a low level.

In the first erase (1), the erase signal is generated, the potential of the word line to be erased is changed to a negative voltage such as −10V and the potential of the source line is set to a relatively high voltage such as +4V. In this case, the potential of the word line which is not to be erased is set to an erase inhibit potential of approximately 2V. In other words, the differential potential between the source and the control gate of the memory cell connected to the word line not to be erased is approximately 2V at most and therefore the tunnel current will not be generated.

In the first erase verify (1), the memory cells are read according to the erase verify (1) activating signal In this case, the erase verify (1) potential EV1 is selected as a voltage which does not cause a deplete failure due to variations of the threshold voltage Vth.

Next, rewrite is carried out on a memory cell in which the deplete failure may be caused In write verify, the potential WV1 of the word line is set to approximately 1 to 2V and rewrite is carried out on a memory cell which is turned on with the potential of the word line.

After this, the second erase (2) is executed. In this case, the erase operation is carried out with a low potential of the source line of approximately 3V. In erase verify, the potential of the word line is set to a voltage EV2 of 3.2V corresponding to the lower limit voltage Vcc min. In erase verify operation, when it is ascertained that all memory cells have a threshold which indicates the data of 0V or over and "1" state, an erase verify pass signal rises to indicate that execution of erase operation is finished according to the fall of this erase verify pass signal and therefore the command latch signal and also the Ready/Busy signal fall. For example, if an allowable fluctuation is ±10% when the power supply voltage Vcc is set as a low voltage such as 3.3V, the above erase verify voltage EV2 is set to 2.9V or under. The voltage to be applied to the control gate, the source region and the drain region in erase, erase verify, pre-write and pre-write verify has the same level as the Vcc 5.0V.

Though it is described in this embodiment that electrons in the floating gate are discharged into the source region by applying −11V to the control gate and 4 or 3V to the source region in erase operation, the embodiment is not limited to the above and, for example, the electrons in the floating gate can be discharged into the drain region by applying −11V to the control gate and 4 or 3V to the drain region.

Figure 6:
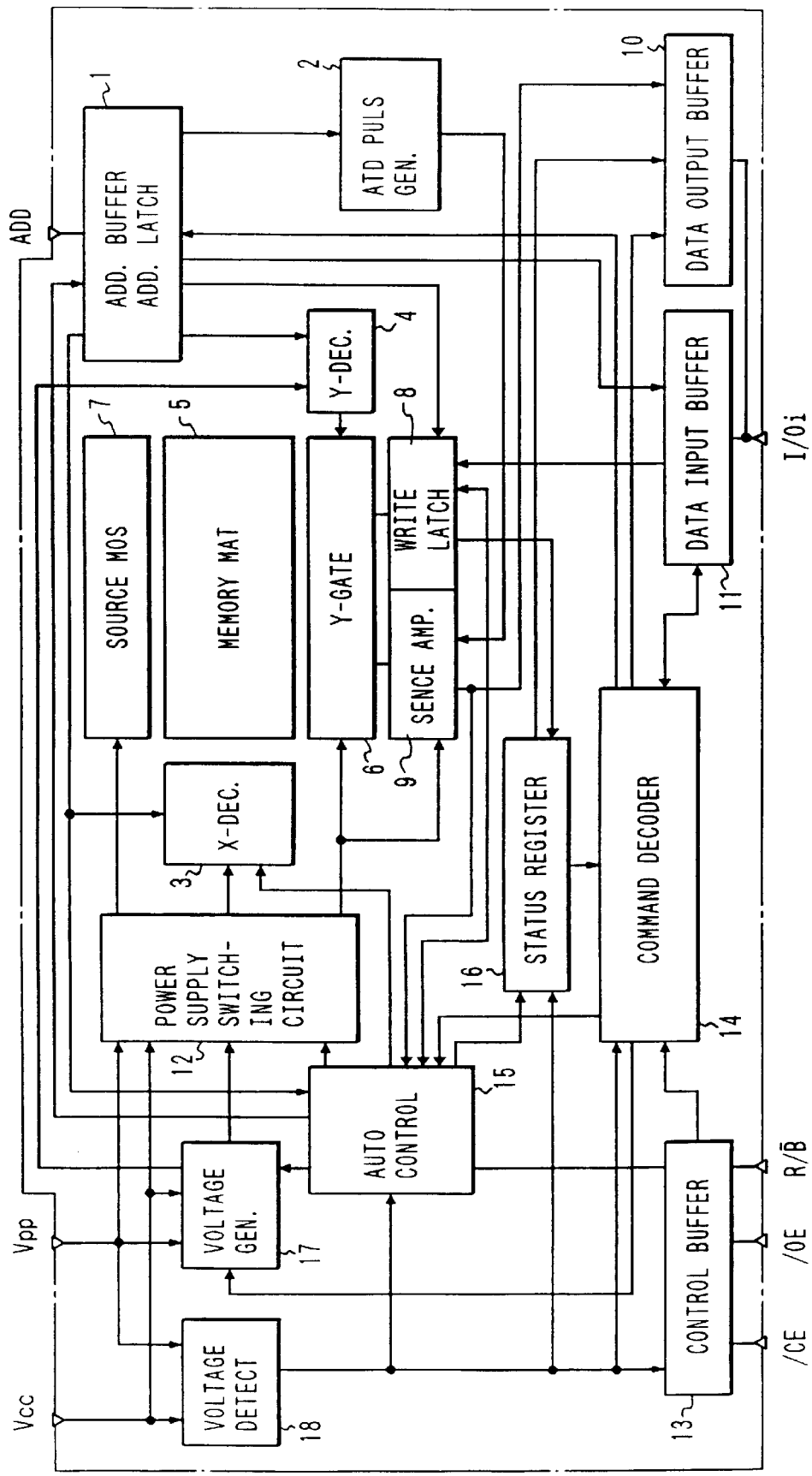
FIG. 6 is a schematic block diagram showing an embodiment of a flash memory according to the present invention.

FIG. 6 shows a schematic block diagram of an embodiment of a flash memory according to the present invention. Respective circuit blocks shown in FIG. 6 are formed on a single semiconductor substrate such as single crystal silicon according to a known manufacturing technology for semiconductor integrated circuits.

Reference numeral 1 is an address buffer which is adapted to provide an address latch function. 2 is an address change detection circuit which generates a one-shot pulse when a change of the address signal is detected. Though not limited, this pulse is used to equalize the potential of the bit line for speeding up read operation.

3 is an X decoder for selecting the word lines of the memory mat 5. In the flash memory, the potential of the word line selected by the X decoder in accordance with a mode of operation is variously set as described above. Specifically, the potential of the word line is set to a high voltage such as +11V for pre-write operation and a negative voltage such as −11V for erase operation. The potential of the word line is set to a potential of WV1, EV1 or EV2 for pre-write or erase verify operation and to a voltage corresponding to the power supply voltage Vcc for read operation. Therefore, a word driver 12 having a voltage changeover function described later is provided at the input side of the X decoder. The X decoder 3 selects the word line according to an address signal from the address buffer in pre-write and erase operations and also selects the word line according to the address signal generated by the address generator of the auto control circuit 15 in write verify and erase verify operations.

4 is a Y decoder for forming a select signal for the bit line of the memory mat 5. The switch of the Y gate circuit 6 is controlled with this select signal for the bit line. The Y gate circuit 6 connects the bit line of the memory mat 5 and a sense amplifier 9 or a write latch circuit 8.

The memory mat 5 is formed with the memory cells which are disposed in a matrix arrangement at intersections of word lines and bit lines. Specifically, the word lines are connected to the control gate, the drain is connected to the bit lines and the source is connected to the source line. The floating gate is provided in a lower layer of the above-described control gate whereby write operation is carried out by injecting electrons into the floating gate and erase operation is carried out by withdrawing (ejecting) these electrons to the source side. Though not limited, a source MOSFET 7 changes over a bias voltage to be supplied to the source line. Specifically, a ground potential is given to the circuit for read and write operations and the potential is changed over to 4V and 3V as described above for erase operation.

A write signal entered from a data input/output terminal I/Oi is entered into the write latch circuit 8 through a data input buffer 11 On the other hand, an output signal of the sense amplifier 9 is outputted to the data input/output terminal I/Oi through a data output buffer 10. The output signal of the sense amplifier 9 is also transmitted to the auto control circuit 15 for verify operation.

A control buffer 13 determines a mode of operation according to a chip enable signal/CE and an output enable signal/OE. For examples when only the signal/CE is set to a low level, the data entered from the data input/output I/Oi is fetched as a command into a command decoder 14. The command decoder 14 decodes the entered command to determine write/erase operation. In case of read mode, the signal/CE and the signal/OE are set to a low level and the control buffer 13 determines this signal level The control buffer 13 outputs the Ready/Busy signal, which is outputted from the auto control circuit 15 to indicate whether or not erase or write operation is being executed in the flash memory, to the external terminal R/B.

The command decoder 14 decodes a command entered and enters a write control signal or an erase control signal into the auto control circuit 15. The auto control circuit 15 carries out a sequence control operation necessary for erase or write operation corresponding to the erasing method described in the embodiment shown in FIG. 1. The auto control circuit 15 is provided with an address counter for generating an address signal for pre-verify, write verify or erase verify in the erase operation as described above and forming an address signal to be entered into the X decoder 3 and the Y decoder 4 through the address buffer. The power changeover circuit 12 changes over a plurality of types of voltages to be supplied to the word lines and supplies it to the X decoder according to the control by the auto control circuit 15. Actually, the power supply changeover circuit 12 selects one voltage from the plurality of types of voltages according to the output and the operation mode signal of the X decoder and drives the word lines.

A status register 16 stores internal statuses of the operation mode and the operation sequence and supplies a low level output enable signal /OE to allow reading from the data output buffer. Specifically, a host system such as a microcomputer verifies the internal status of the flash memory by data polling or the like and performs the control. In other words, when the microcomputer generates an erase command and an address signal to the flash memory in erase operation which requires a long duration of time of approximately 10 ms as described above, the flash memory is immediately disconnected from the bus, the other peripheral unit is connected to the bus to start another data processing during the above erasing time. When completion of erase operation is detected by the above-described data polling, write operation can be started.

A voltage detection circuit 18 detects the power supply voltage Vcc and a high voltage Vpp. Particularly, the high voltage to be supplied for write or erase operation should be a high voltage such as 12V and therefore the voltage detection circuit is used. A voltage generating circuit 17 generates the voltages WV1, EV1 and EV2 for the above-described verify operation as well as an erase inhibit voltage and a negative voltage for erase operations A series of erase operations can be executed by the auto control circuit which is internally provided as described in this embodiment and therefore a flash memory which is easily operated can be obtained.

Figure 7:
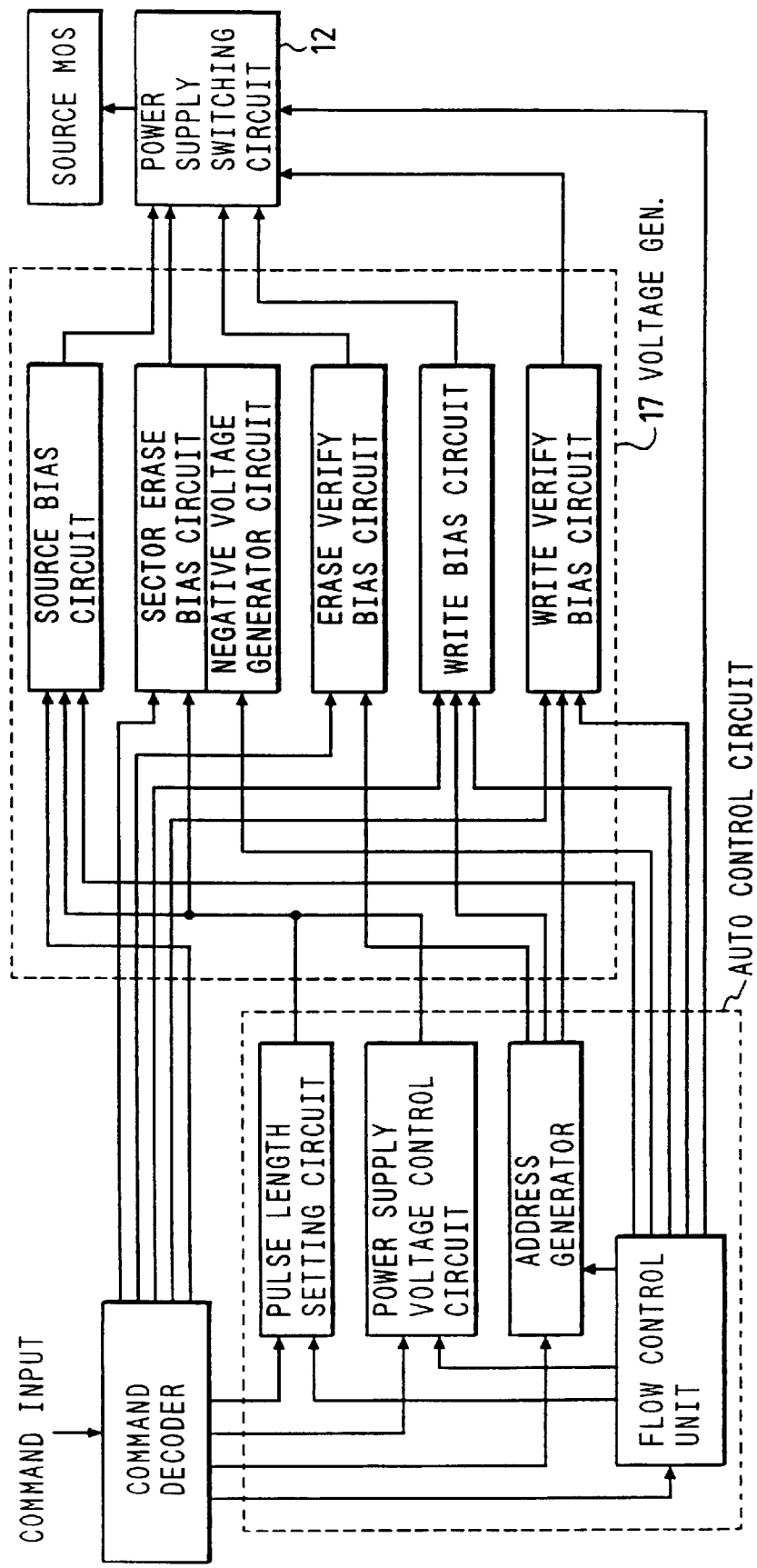
FIG. 7 is a schematic block diagram showing an embodiment of an auto control circuit of the flash memory shown in FIG. 6.

FIG. 7 shows a schematic block diagram of an embodiment of the auto control circuit and the voltage generating circuit. The auto control circuit is divided into the one for controlling the voltage generating circuit 17 and the one for controlling the power supply changeover circuit 12. The circuit for controlling the voltage generating circuit 17 is a flow control unit and the erasing time is set according to a signal from the command decoder by a pulse length setting circuit, and a source bias voltage is set by the power supply voltage control circuit. As in the above-described embodiment, erase operation is divided into two operations and carried out and, for the erase operation to be carried out by changing over the source voltage, the erase pulse length is fixed. The flow control unit stores various programs for executing an erase flow for erase operation shown in FIG. 1 and a write flow for write operations which is not shown in this embodiment. These programs are activated according to the contents of the commands decoded by the command decoder.

The first erase time can differ from the second erase time in accordance with the above-described changeover of the source voltage. For example, in the first erase operation, an erase energy to be determined by the voltage and the time is increased by setting the source voltage to a large voltage such as 4V and extending the erase time and, in the second erase operation, the erase energy is reduced by setting the source voltage to a low voltage such as 3V and reducing the erase time, thus controlling the variations of the threshold voltage Vth to be less. Otherwise, it can be adapted to execute the erase operation equivalent to that in a case that the source voltage is reduced by setting the source voltage to the same 4V as above and reducing the second erase time to be far shorter than the first erase time by the pulse length setting circuit.

Various kinds of voltages produced by a sector (word line unit) erase bias circuit, an erase verify bias circuit, a write bias circuit and a write verify bias circuit are supplied to the X decoder. Specifically, the potential of the word line is set to two kinds of bias voltages for the word line to be erased and the word line not to be erased (erase inhibit) in the sector erase bias circuit. EV1 and EV2 corresponding to the first and second erase operations are set in the erase verify bias circuit. A bias voltage corresponding to write operation is set in the write bias circuit. A bias voltage for ordinary write operation and a bias voltage WV1 corresponding to rewrite are set in the write verify bias circuit. These circuits are operated with the timing pulses generated by the address generator.

Figure 8:
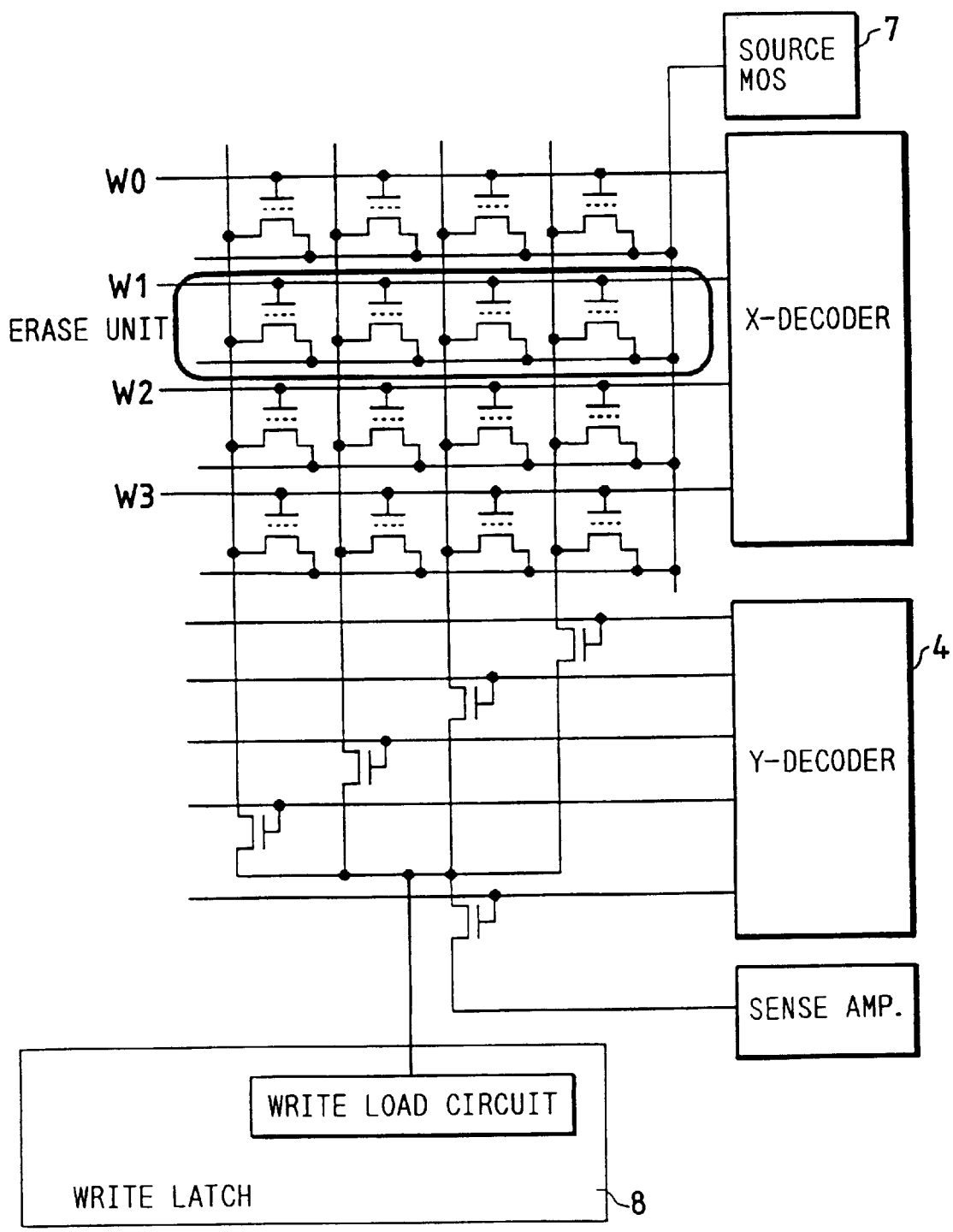
FIG. 8 is a block diagram showing an embodiment of a memory mat and peripheral circuits of the flash memory according to the present invention.

FIG. 8 shows a block diagram of an embodiment of the memory mat and the peripheral circuit. The memory mat is formed with the memory cells, each comprising a control gate shown with a solid line and a floating gate shown with a broken line, which are disposed in a matrix arrangement at the intersections of the word lines W0~W3 extended in horizontal direction and the bit lines extended in vertical direction. The above word lines are driven by the X decoder and the bit lines are connected to the write load circuit in the write latch circuit 8 through the Y gate comprising a MOSFET which is switch-controlled by the Y decoder 4. The bit line is connected to the sense amplifier through a switch MOSFET which is switch-controlled by the Y decoder 4.

Though not limited the erase unit can be a word line unit (sector). 2048 memory cells are connected to the word lines and therefore erase operation in an erase unit of approximately 2K bits is carried out. Instead of this construction, erase operation in a block unit comprising a plurality of word lines or a batch erase operation of the memory mat can be carried out. The number of word lines to be selected in erase operation is increased in accordance with such erase unit as described above. In erase verify operation, the addresses of the word lines are changed over and a plurality of word lines corresponding to the erase unit are changed over in sequence.

Figure 9:
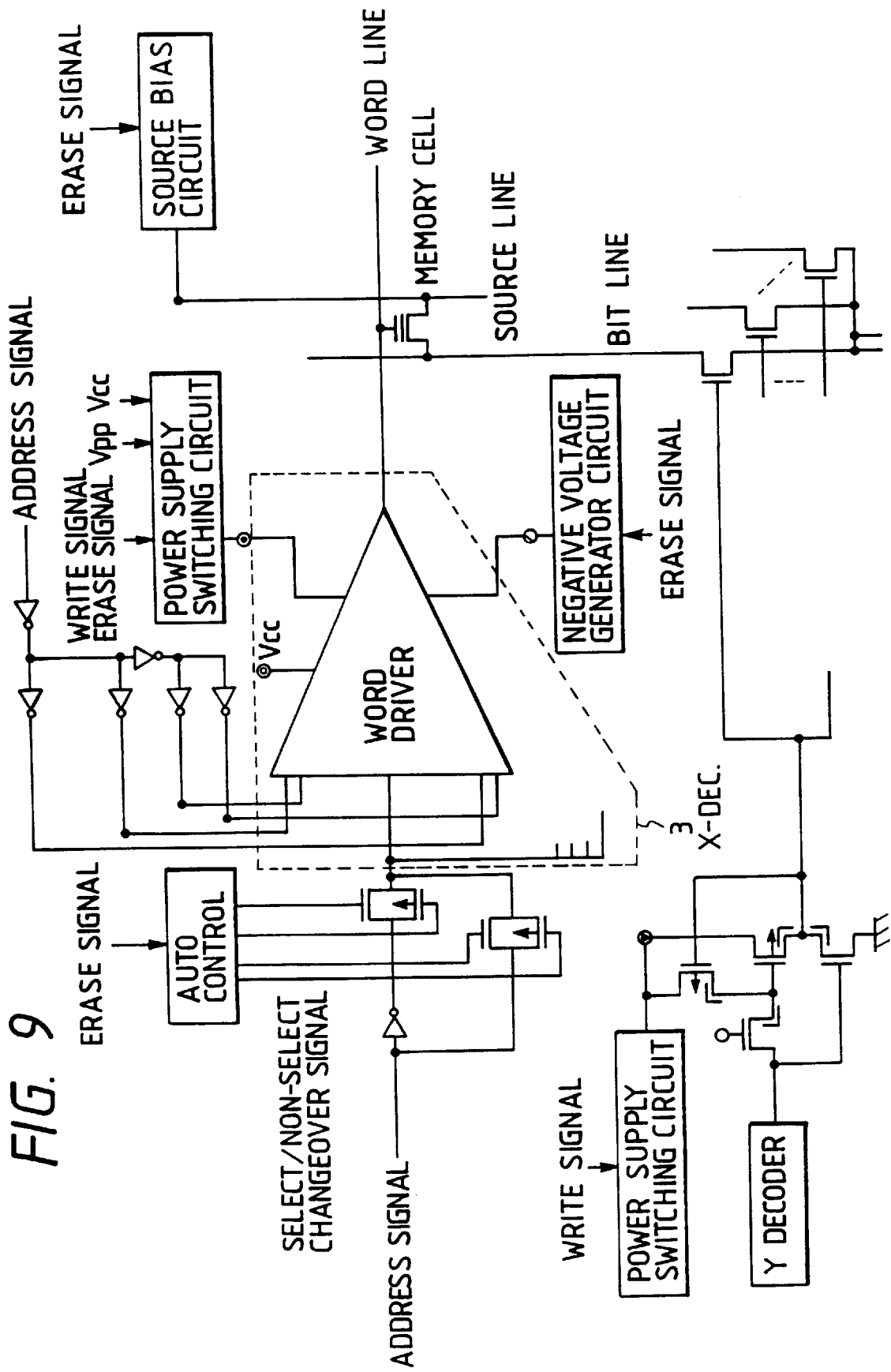
FIG. 9 is a concrete circuit diagram showing an embodiment of a partly selected circuit of the memory mat in the flash memory according to the present invention.

FIG. 9 shows a concrete circuit diagram of an embodiment of a partly selected circuit of the memory mat. In FIG. 9, parts of the selection circuit for the word lines and the selection circuit for the bit lines are shown The word driver in the X decoder 3 shown in FIG. 9 transmits a negative voltage generated from the negative voltage generator circuit, Vpp or Vcc to be selectively supplied through the power supply changeover circuit and a bias voltage supplied from the bias voltage terminal to the word lines.

This word driver changes over selection or non-selection according to the address signals supplied. Specifically, a selected word line has a high level and a word line which is not selected has a low level in write operation and read operation, while the selected word line has a low level such as a negative voltage and the word line which is not selected has a high level corresponding to erase inhibit in erase operation and therefore the X decoder reverses the level accordingly and transmits the levels to the word driver.

The source bias circuit supplies a relatively high voltage such as 4V to the source line according to the erase signal in the first erase operation and a relatively low voltage such as 3V to the source line in the second erase operation. In the operations other than the erase operation, or in the write and read operations (including verify), the source bias circuit supplies a ground potential to the circuit.

The output part of the Y decoder is provided with a level conversion circuit. A write high voltage Vpp is selectively supplied to this level conversion circuit by the voltage changeover circuit which is controlled according to a write signal. Specifically, in write operation, a high level corresponding to Vcc generated from the Y decoder is supplied to the gate of the switch MOSFET to supply a voltage such as 4V higher than the power supply voltage Vcc (3.3V) as described above to the bit lines and switch control is carried out. With this, there is no level loss due to the threshold in the switch MOSFET and a high voltage such as 4V generated from the write load circuit described in the following can be supplied to the bit lines.

In FIG. 9, the P channel type MOSFET to the gate of which an arrow mark is added is discriminated from the N channel type MOSFET. The MOSFET in which a L-shaped line is added to the drain to which the high voltage of the MOSFET is supplied indicates that this MOSFET is resistant to a high voltage. This is the same in the circuit described below.

Figure 10:
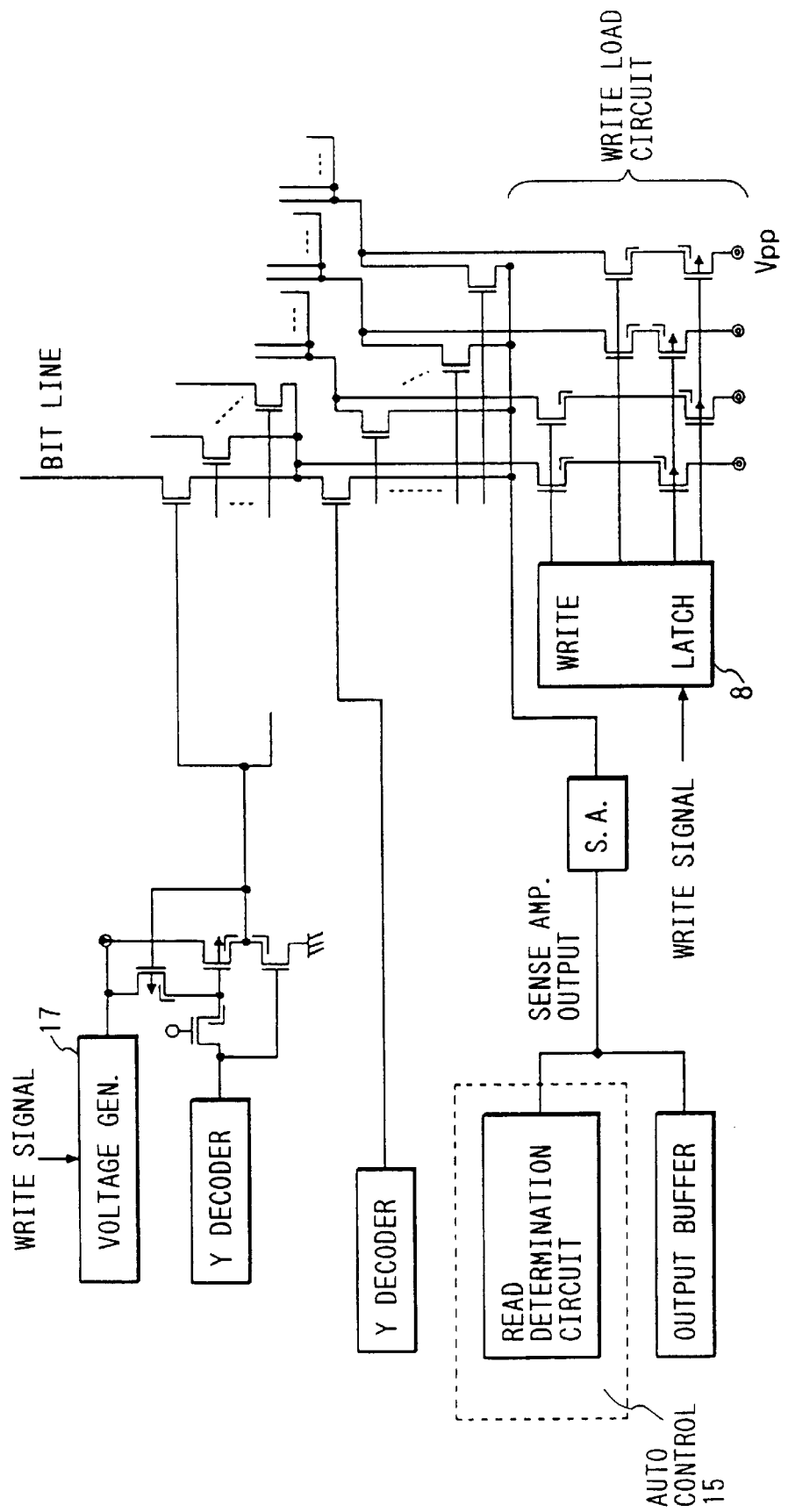
FIG. 10 is another concrete circuit diagram showing an embodiment of a partly selected circuit of the memory mat in the flash memory according to the present invention.

FIG. 10 shows a concrete circuit diagram of an embodiment of the other partly selected circuit of the memory mat. In FIG. 10, the bit line selection circuit is mainly shown. Accordingly, part of the it line selection circuit is shown overlapped with that in FIG. 9. In other words, the Y gate circuit which is the bit line selection circuit is divided into two steps. One of two divided Y decoders is supplied to the gate of a switch MOSFET one end of which is connected to the bit line through the level conversion circuit as described above. A switch MOSFET which is switch-controlled by the other Y decoder is provided corresponding to a plurality of switch MOSFETs. These switch MOSFETs of the second step are dedicated for read operation and therefore the selection signal of the corresponding Y decoder is directly supplied to these MOSFETs. These switch MOSFETs connect the signal of a selected bit line to the input terminal of the sense amplifier SA. The output signal of the sense amplifier SA is supplied to the output buffer and the read determination circuit to be used in verify operation. When the read determination circuit determines that the output of the sense amplifier SA supplied does not satisfy the specified value, the read determination circuit makes the auto control circuit output various control signals for executing again write or erase operation.

Figure 11:
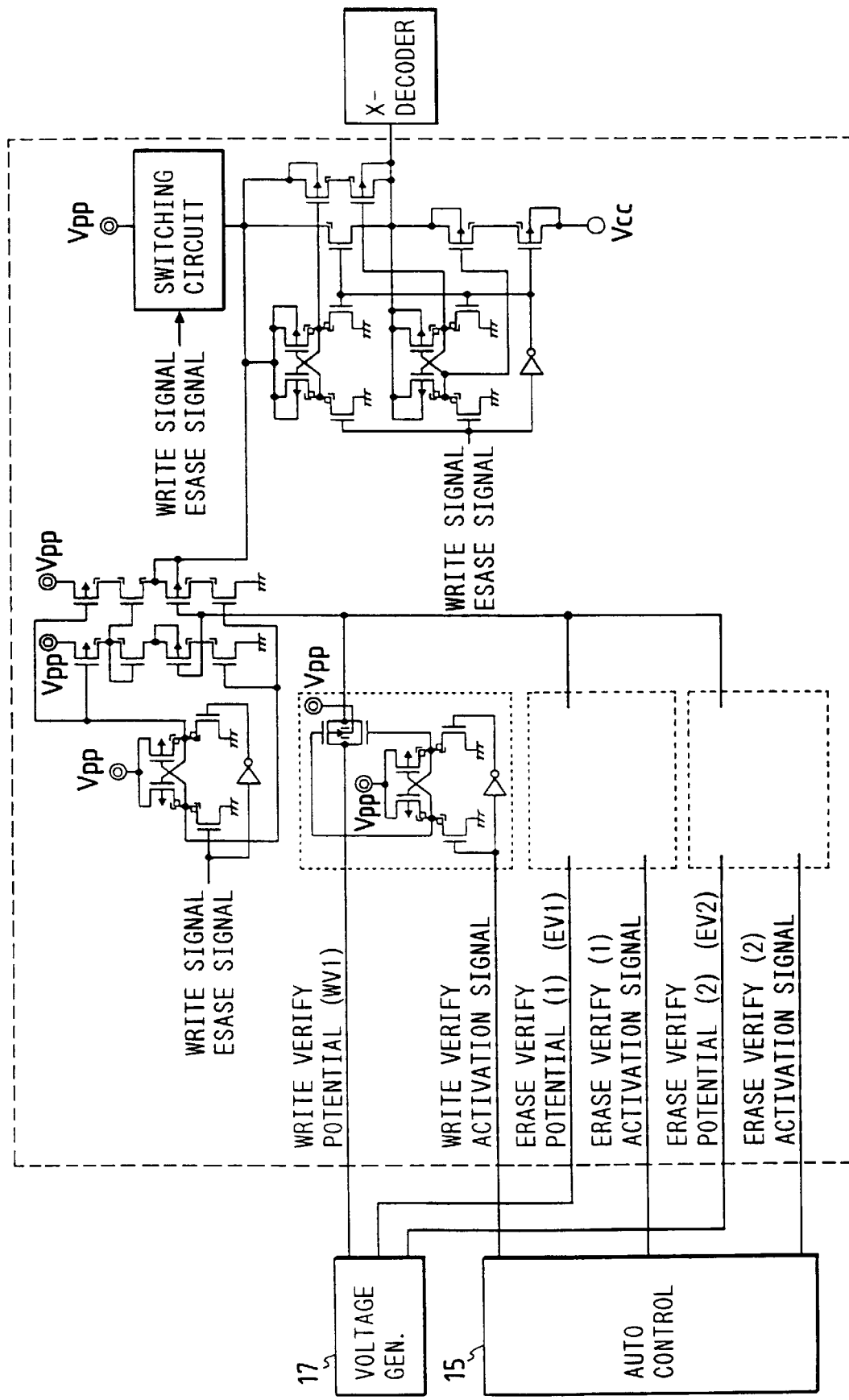
FIG. 11 is a circuit diagram showing an embodiment of a voltage changeover circuit in the flash memory according to the present invention.

The write latch circuit 8 enables write (page write) in a unit of a plurality of bit lines Specifically, the data as much as for a plurality of bit lines is stored in the write latch circuit 8 and the write high voltage Vpp is transmitted to the bit lines by controlling the switch MOSFETs with the write signal. For write operation on one bit line, only one of write load circuits corresponding to the plurality of bit lines is activated FIG. 11 shows a circuit diagram of an embodiment of the power supply changeover circuit 12. The power supply changeover circuit 12 outputs one of Vpp, Vcc, write verify voltage WV1 and erase verify voltages EV1 and EV2 as a potential to be supplied to the X decoder 3 in response to the write signal and the erase signal while using the power supply voltage Vcc and the write high voltage Vpp as inputs. The write verify voltage WV1 shifts the level of the control signal for the switch MOSFET which transmits WV1 to a corresponding high voltage according to the high voltage Vpp to detect that the threshold voltage of the memory cells is made larger than Vcc. Thus, a switch control signal to be transmitted to the gate of the switch MOSFET which outputs a voltage higher than the power supply voltage such as 3.3V is outputted through the level conversion circuit. The level conversion circuit comprises the P channel type MOSFET whose gate and drain are connected as being intersected and the N channel type MOSFET which is provided between the drain of the above P channel type MOSFET and the ground potential of the circuit and to the gates of which a negative phase input signal is supplied.

Figure 12:
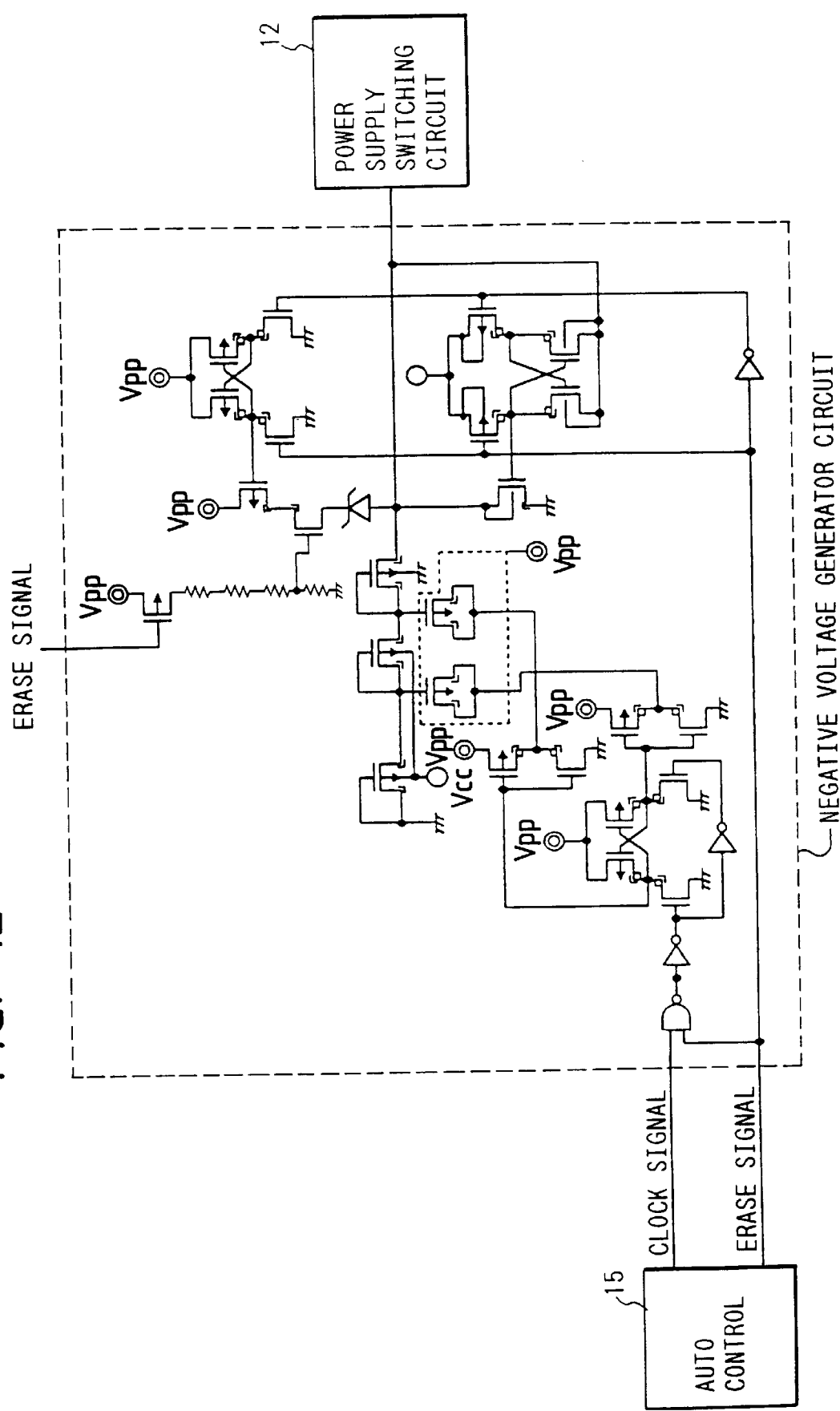
FIG. 12 is a circuit diagram showing an embodiment of a negative voltage generating circuit in the flash memory according to the present invention.

FIG. 12 shows a circuit diagram of an embodiment of a negative voltage generator circuit in the voltage generator circuit 17. The negative voltage generator circuit supplies a clock pulse to the level conversion circuit through a gate circuit controlled with the erase signal and converts it to the Vpp level, and a negative voltage is generated by a charge pump circuit to be driven with the converted signal. Such negative voltage is a fixed voltage set by a Zener diode based on the erase potential. A sum voltage of the threshold voltage and the Zener voltage of the MOSFET to the gate of which the erase voltage is supplied is transmitted as an erase voltage to the power supply changeover circuit 12. The drain of the MOSFET to the gate of which the above erase voltage is supplied is connected to high voltage Vpp through the P channel type MOSFET. This P channel type MOSFET is switch-controlled according to the level conversion circuit which receives the erase signal and set to OFF for operations other than erase operation.

A level conversion circuit which admits the above negative voltage as an operating voltage is provided to make off the N channel type MOSFET provided between the negative voltage output and the ground potential of the circuit in the erase operation and make on this MOSFET when the erase operation is finished, thereby resetting the negative voltage to the ground potential of the circuit.

FIG. 13 shows a diagram showing relative relations of respective signals with an emphasis on the microprocessor CPU and the flash memory. The chip enable signal, the output enable signal and the write enable signal to be supplied respectively to the chip enable terminal /CE, output enable terminal /OE and write enable terminal /WE are generated respectively by the gate circuits which receive the signals which are obtained by decoding the address signals for designating an address space assigned to the flash memory in the address decoder and signals /RD and /WR for designating the operation modes. In this embodiment, the write mode is according to a low level write enable signal to be supplied to the write enable terminal /WE. However, this terminal /WE can be omitted when designating the write mode according to the command as described above.

The data buffer is a bidirectional buffer which transfers write data from the microcomputer to the flash memory. For designating an operation mode with a command, the data is transferred in the above-described direction. In read operation, the data read out from the flash memory is transferred to the microcomputer.

The data register fetches the data to control the relay to switch over a voltage of 5V or 12V to the high voltage terminal Vpp and supply the voltage to this terminal when accessing the flash memory.

In the microcomputer system of this embodiment, the flash memory has an automatic erasing function as described above and therefore the microcomputer (MPU) generates those signals /RD, /WE and /DEN and commands for designating the addresses to be erased of the flash memory and an erase mode. After this, the flash memory internally enters into the automatic erase mode as described above. When the flash memory enters into the erase mode, the address terminals, data terminals and all control terminals are made free as described above and the flash memory is electrically separated from the microcomputer MPU. The microcomputer MPU is able to execute data processing including information transfer among other memory units ROM and RAM, not shown, or input and output ports by using the system buses after designating only the erase mode for the flash memory.

Thus, erase operation can be executed with the flash memory mounted in the system as a full-function memory (rewrite is possible for each byte) without any sacrifice of the throughput of the system. The microprocessor CPU designates a data polling mode for the flash memory with an appropriate interval after designating an erase mode as described above, reads the contents of the status register and designates write if there is the data to be stored in the flash memory after completion of the erase operations.

Operations and effects obtained from the above embodiments are as described below.

(1) The batch erasable nonvolatile memory apparatus provided with the memory cells which are adapted to execute erase operation by ejecting a charge accumulated at the floating gate in write operation is provided with an automatic erasing circuit for carrying out in sequence a first operation for reading out the memory cells of the erase unit in batch erase operation of nonvolatile memory cells and executing pre-write on the nonvolatile memory cells without a charge stored at their floating gates, a second operation for executing batch erase operation at a high speed for the above nonvolatile memory cells of the above erase unit with a relatively large energy under a relatively high erase reference voltage, a third operation for reading out all nonvolatile memory cells which have been erased and executing write operation for the nonvolatile memory cells which have been set to a relatively low threshold voltage, and a fourth operation for executing batch erase operation of the nonvolatile memory cells of the above erase unit at a low speed with a relatively small energy under a relatively low erase reference voltage, thereby providing such effects as detection of the memory cells which may be depletively erased in the above third operation and rewrite to be carried out in advance, and setting of the threshold voltage under an erased condition at a low voltage in high accuracy while preventing depletive erase by combination with batch erase operation with less variations based on a low energy in the above fourth operations.

(2) According to (1) above, an effect that the operating voltage of the flash memory can be low as approximately 3V can be obtained.

(3) An effect can be obtained that the threshold voltage for erased condition can be set with high accuracy in a short period of time by setting the source potential of the nonvolatile memory cells in erase operation in the above second operation at a relatively high voltage and the source potential of the nonvolatile memory cells in erase operation in the above fourth operation at a relatively low voltage.

(4) In write operation for injecting a electric charge into the floating gates, an effect that write time can be reduced and therefore operation can be speeded up by using hot electrons produced near the drain can be obtained.

(5) The batch erasable nonvolatile memory apparatus provided with the memory cells which are adapted to execute erase operation by discharging a charge accumulated at the floating gate in write operation carries out in sequence a first operation for reading out the memory cells of the erase unit and executing pre-write on the nonvolatile memory cells at the floating gates of which no charge is stored, a second operation for executing batch erase operation for the above nonvolatile memory cells of the above erase unit with a relatively large energy under a relatively high erase reference voltage, a third operation for reading out all nonvolatile memory cells which have been erased and executing weak write operation for the nonvolatile memory cells which have been set to a relatively low threshold voltage, and a fourth operation for executing batch erase operation of the nonvolatile memory cells of the above erase unit at a low speed with a relatively small energy to provide a relatively low erase reference voltage, thereby providing such effects as detection of the memory cells which may be depletively erased in the above third operation and rewrite to be carried out in advance, and setting of the threshold voltage under an erased condition at a low voltage in high accuracy while preventing depletive erase by combination with batch erase operation with less variations based on a low energy in the above fourth operation.

(6) In the above erasing method, an effect can be obtained that the threshold voltage for erased condition can be set with high accuracy in a short period of time by setting the source potential of the nonvolatile memory cells in erase operation in the above second operation at a relatively high voltage and the source potential of the nonvolatile memory cells in erase operation in the above fourth operation at a relatively low voltage.

The above has described the present invention made by the present inventor according to the embodiments of the present invention. However, it is obviously known that the present invention is not limited to these embodiments and available in diversified modifications without deviating from the spirit of the present invention. For example, the above-described erasing method can be not only executed by the auto control circuit built in the flash memory but also by directly entering control signals and address signals necessary for erase operation as described above from the control circuit or the microcomputer provided outside the flash memory.

Write operation of the flash memory can be carried out not only by using hot electrons as described above but also by injecting electrons with the tunnel current into the floating gates. A practical circuit for making the above-described erase sequence effective is available in various modes.

The present invention can be widely used as the flash memory and the erasing method thereof.

Those effects obtained from a representative mode of the present invention disclosed in the present application are briefly described below. Specifically, the batch erasable nonvolatile memory apparatus, which is provided with the memory cells which are adapted to execute erase operation by discharging a charge accumulated at the floating gate in write operations is provided with an automatic erasing circuit for carrying out in sequence a first operation for reading out the memory cells of the erase unit in batch erase operation of nonvolatile memory cells and executing pre-write on the nonvolatile memory cells without a charge stored at their floating gates, a second operation for executing batch erase operation at a high speed for the above nonvolatile memory cells of the above erase unit with a relatively large energy under a relatively high erase reference voltage, a third operation for reading out all nonvolatile memory cells which have been erased and executing write operation for the nonvolatile memory cells which have been set to a relatively low threshold voltage, and a fourth operation for executing batch erase operation of the nonvolatile memory cells of the above erase unit at a low speed with a relatively small energy under a relatively low erase reference voltage, thereby providing such effects as detection of the memory cells which may be depletively erased in the above third operation and rewrite to be carried out in advance, and setting of the threshold voltage under an erased condition at a low voltage in high accuracy while preventing depletive erase by combination with batch erase operation with less variations based on a low energy in the above fourth operation.

According to the above, the operating voltage of the flash memory can be as low as approximately 3V.

The threshold voltage for erased condition can be set with high accuracy in a short period of time by setting the source potential of the nonvolatile memory cells in erase operation in the above second operation at a relatively high voltage and the source potential of the nonvolatile memory cells in erase operation in the above fourth operation at a relatively low voltage.

A time necessary for write operation for injecting electrons into the above floating gates can be reduced by using hot electrons generated nearby the drain and therefore write operation can be speeded up.

The batch erasable nonvolatile memory apparatus provided with the memory cells which are adapted to execute erase operation by ejecting a charge accumulated at the floating gate in write operation carries out in sequence a first operation for reading out the memory cells of the erase unit and executing pre-write on the nonvolatile memory cells at the floating gates of which no charge is stored, a second operation for executing batch erase operation for the above nonvolatile memory cells of the above erase unit with a relatively large energy under a relatively high erase reference voltage, a third operation for reading out all nonvolatile memory cells which have been erased and executing weak write operation for the nonvolatile memory cells which have been set to a relatively low threshold voltage, and a fourth operation for executing batch erase operation of the nonvolatile memory cells of the above erase unit at a low speed with a relatively small energy to provide a relatively low erase reference voltage, thereby providing such effects as detection of the memory cells which may be depletively erased in the above third operation and rewrite to be carried out in advance, and setting of the threshold voltage under an erased condition at a low voltage in high accuracy while preventing depletive erase by combination with batch erase operation with less variations based on a low energy in the above fourth operation.

In the above erasing method, the threshold voltage for erased condition can be set with high accuracy in a short period of time by setting the source potential of the nonvolatile memory cells in erase operation in the above second operation at a relatively high voltage and the source potential of the nonvolatile memory cells in erase operation in the above fourth operation at a relatively low voltage.

What is claimed is:

1. A nonvolatile memory device comprising:
   a plurality of memory cells which store information as values of a threshold voltage, wherein each of said plurality of memory cells has a floating gate;
   a command decoder decoding a command supplied thereto; and
   a control circuit controlling a specified operation according to a result of decoding by said command decoder;
   wherein said control circuit controls execution of a pre-write operation, a first ejecting operation, an injecting operation and a second ejecting operation in accordance with a result of decoding of a command indicating a threshold voltage changing operation by said command decoder, said prewrite operation injecting electrons into the floating gates to set the threshold voltage of the memory cells in a first positive voltage region, said first ejecting operation ejecting electrons from the floating gates and setting a threshold voltage of said plurality of memory cells to be lower than a second positive voltage, said injecting operation injecting electrons into the floating gates to set the threshold voltage of the memory cells, which is determined to be higher than 0V and lower than a third positive voltage, to be higher than said third positive voltage after said first ejecting operation, and said second ejecting operation ejecting electrons from the floating gates to set the threshold voltage of said plurality of memory cells to be higher than 0V after said injecting operation.

2. The nonvolatile memory device according to claim 1, wherein each of said plurality of memory cells has a control gate under which said floating gate is formed and further has a first semiconductor region and a second semiconductor region such that a channel forming region between said first and second semiconductor regions underlies said floating gate.

3. The nonvolatile memory device according to claim 2, further comprising a voltage generator circuit generating a first voltage and a second voltage from a power supply voltage to be supplied.

4. The nonvolatile memory device according to claim 3, further comprising a plurality of word lines each of which is coupled with the control gate of corresponding ones of said memory cells, and said first and said second voltages being selectively applied to ones of said plurality of word lines.

5. The nonvolatile memory device according to claim 4, wherein a difference between an internal voltage to be supplied to the control gate of a memory cell and an internal voltage to be applied to the first semiconductor region of that memory cell in said first ejecting operation is larger than a difference between the internal voltage to be applied to the control gate of said memory cell and the internal voltage to be applied to the first semiconductor region of said memory cell in said second ejecting operation.

6. The nonvolatile memory device according to claim 5, wherein said pre-write operation, said first ejecting operation, said injecting operation and said second ejecting operation are executed to erase data stored in said plurality of memory cells.

7. The nonvolatile memory device according to claim 6, wherein said first semiconductor region is a source region.

8. The nonvolatile memory device according to claim 7, wherein a voltage to be applied to the source region in said first ejecting operation is higher than a voltage to be applied to the source region in said second ejecting operation.

9. The nonvolatile memory device according to claim 8, wherein said injecting operation is executed by using hot electrons.

10. The nonvolatile memory device according to claim 9, wherein each of a plurality of memory cells consists essentially of a single transistor which comprises:
a semiconductor body;
said first semiconductor region and said second semiconductor region which are formed in said semiconductor body;
a first insulating film covering at least said channel forming region between said first and second semiconductor regions at a surface of said semiconductor body;
said floating gate covering said first insulating film at least between said first and second semiconductor regions;
a second insulating film covering said floating gate at least between said first and second semiconductor regions; and
said control gate covering said second insulating film at least between said first and second semiconductor regions.

11. The nonvolatile memory device according to claim 10, wherein said first positive voltage region is higher than said second positive voltage and said second positive voltage is higher than said third positive voltage.

12. A method for changing a threshold voltage of a plurality of memory cells, each having a floating gate, a control gate and a pair of semiconductor regions, by ejecting electrons in the floating gates, the method comprising the steps of:
injecting electrons into the floating gates to set the threshold voltage of the memory cells in a first positive voltage region, in a prewrite operation;
ejecting electrons from said floating gates to make a threshold voltage of said plurality of memory cells be lower than a second positive voltage, in a first ejecting operation;
injecting electrons into the floating gates to make the threshold voltage of memory cells, whose threshold voltage is determined to be 0V or over and lower than a third positive voltage, be higher than said third positive voltage after said first ejecting operation, in an injecting operation; and
ejecting electrons from said floating gates to make the threshold voltage of said plurality of memory cells be higher than 0V after said injecting operation, in a second ejecting operation.

13. The method for changing a threshold voltage according to claim 12, wherein a difference between a voltage to be applied to said control gates of the memory cells and a voltage to be applied to one of said pair of semiconductor regions thereof in said first ejecting operation is larger than a difference between a voltage to be applied to said control gates of said memory cells and a voltage to be applied to the said one of said pair of semiconductor regions thereof in said second ejecting operation.

14. A nonvolatile memory device comprising:
a plurality of blocks, each comprising a word line, a plurality of data lines and a plurality of memory cells, said plurality of memory cells storing information as values of a threshold voltage;
a selecting unit selecting at least one block of the plurality of blocks;
a command decoder decoding a command supplied thereto; and
a control circuit controlling a specified operation according to a result of decoding by said command decoder;
wherein each of said plurality of memory cells has a floating gate; and
wherein said control circuit controls execution of a first injecting operation, a first ejecting operation, a second injecting operation and a second ejecting operation in accordance with a result of decoding of a command indicating a threshold voltage changing operation by said command decoder; in which
(i) said first injecting operation is for injecting electrons into the floating gates to set the threshold voltage of the memory cells in a first positive voltage region;
(ii) said first ejecting operation is for ejecting electrons from the floating gates and setting a threshold voltage of said plurality of memory cells in a selected at least one block to be lower than a second positive voltage;
(iii) said second injecting operation is for injecting electrons into the floating gates to set the threshold voltage of the memory cells, which is determined to be higher than 0V and lower than a third positive voltage which is lower than said second positive voltage, to be higher than said third positive voltage after said first ejecting operation is performed; and
(iv) said second ejecting operation is for ejecting electrons from the floating gates to set the threshold voltage of said plurality of memory cells in said selected at least one block to be higher than 0V after said second injecting operation is performed.

15. The nonvolatile memory device according to claim 14, wherein each of said plurality of memory cells further has a control gate over which said floating gate is formed, a first semiconductor region and a second semiconductor region which are extended under a part of said floating gate.

16. The nonvolatile memory device according to claim 15, further comprising a voltage generator circuit generating a first voltage and a second voltage, on the basis of a power supply voltage applied thereto, during a verify operation associated with said first and second ejecting operation.

17. The nonvolatile memory device according to claim 16, wherein each of said plurality of word lines is coupled to the control gate of corresponding memory cells, and said first and second voltages are applied to a word line in the selected one of said plurality of blocks.

18. The nonvolatile memory device according to claim 17, wherein a difference between an internal voltage to be applied to the control gate of a memory cell and an internal voltage to be applied to said first semiconductor region thereof in said first ejecting operation is larger than a difference between an internal voltage to be applied to said control gate and an internal voltage to be applied to said first semiconductor region thereof in said second ejecting operation, in those ones of memory cells in said selected at least one block.

19. The nonvolatile memory device according to claim 18, wherein said first semiconductor region is a source region.

20. The nonvolatile memory device according to claim 19, wherein electrons in each of said floating gates are ejected therefrom to each of the source regions in said first and second ejecting operations.

21. The nonvolatile memory device according to claim 18, wherein said first semiconductor region is a drain region.

22. The nonvolatile memory device according to claim 21, wherein electrons in each of said floating gates are ejected therefrom to each of the drain regions in said first and second ejecting operations.

23. The nonvolatile memory device according to claim 17, wherein a time in which internal voltages are applied to said control gate and to said first and second semiconductor regions in said first ejecting operation is different from a time in which internal voltages are applied to said control gate and to one of said first and second semiconductor regions in said second ejecting operation, of memory cells in said selected at least one block.

24. The nonvolatile memory device according to claim 20,
wherein each of said plurality of memory cells consists essentially of a single transistor which comprises:
a semiconductor body;
said first semiconductor region, constituting the source, and said second semiconductor region which are formed in said semiconductor body;
a first insulating film covering at least a channel forming region between said first and second semiconductor regions at a surface of said semiconductor body;
said floating gate covering said first insulating film at least between said first and second semiconductor regions;
a second insulating film covering said floating gate at least between said first and second semiconductor regions; and
said control gate, covering said second insulating film at least between said first and second semiconductor regions.

25. The nonvolatile memory device according to claim 24, wherein the memory device is a single chip nonvolatile semiconductor device.

26. The nonvolatile memory device according to claim 22,
wherein each of said plurality of memory cells consists essentially of a single transistor which comprises:
semiconductor body;
said first semiconductor region, constituting the drain, and said second semiconductor region which are formed in said semiconductor body;
a first insulating film covering at least a channel forming region between said first and second semiconductor regions at a surface of said semiconductor body;
said floating gate covering said first insulating film at least between said first and second semiconductor regions;
a second insulating film covering said floating gate at least between said first and second semiconductor regions; and
said control gate, covering said second insulating film at least between said first and second semiconductor regions.

27. The nonvolatile memory device according to claim 26, wherein the memory device is a single chip nonvolatile semiconductor device.

28. The nonvolatile memory device according to claim 21,
wherein each of said plurality of memory cells consists essentially of a single transistor which comprises:
a semiconductor body;
said first semiconductor region and said second semiconductor region which are formed in said semiconductor body;
a first insulating film covering at least a channel forming region between said first and second semiconductor regions at a surface of said semiconductor body;
said floating gate covering said first insulating film at least between said first and second semiconductor regions;
a second insulating film covering said floating gate at least between said first and second semiconductor regions; and
said control gate, covering said second insulating film at least between said first and second semiconductor regions.

29. The nonvolatile memory device according to claim 28, wherein the memory device is a single chip nonvolatile semiconductor device.

30. A nonvolatile memory device comprising:
a plurality of blocks each comprising a word line, a plurality of data lines and a plurality of memory cells, said plurality of memory cells storing information as values of a threshold voltage;
a selecting unit selecting at least one block of the plurality of blocks;
a command decoder decoding a command supplied thereto; and
a control circuit controlling a specified operation according to a result of decoding by said command decoder;
wherein each of said plurality of memory cells has a floating gate; and
wherein said control circuit controls execution of an injecting operation, an ejecting operation, a verify operation and a threshold voltage setting operation in accordance with a result of decoding of a command indicating a threshold voltage changing operation by said command decoder; in which
(i) said injecting operation is for injecting electrons into the floating gates to set the threshold voltage of the memory cells in a first positive voltage region;
(ii) said ejecting operation is for ejecting electrons from the floating gates;
(iii) said verify operation is for verifying whether a threshold voltage of each of said plurality of memory cells in a selected block is set into a predetermined range which is higher than 0V and which is lower than a second positive voltage; and
(iv) said threshold voltage setting operation is for setting only a threshold voltage of outside of said predetermined range into said predetermined range when a memory cell having a threshold voltage of said outside of said predetermined range is verified in said verify operation.

31. The nonvolatile memory device according to claim 30, wherein each of said plurality of memory cells further has a control gate, a first semiconductor region and a second semiconductor region.

32. The nonvolatile memory device according to claim 31, wherein said electrons in the floating gate are ejected therefrom to one of said first and second semiconductor regions in said ejecting operation.

33. The nonvolatile memory device according to claim 32,
wherein each of said plurality of memory cells consists essentially of a single transistor which comprises:
a semiconductor body;
said first semiconductor region and said second semiconductor region which are formed in said semiconductor body;
a first insulating film covering at least a channel forming region between said first and second semiconductor regions at a surface of said semiconductor body;

said floating gate covering said first insulating film at least between said first and second semiconductor regions;

a second insulating film covering said floating gate at least between said first and second semiconductor regions; and said control gate, covering said second insulating film at least between said first and second semiconductor regions.

34. The nonvolatile memory device according to claim 33, wherein the memory device is a single chip nonvolatile semiconductor device.

35. A nonvolatile memory device comprising:

a plurality of memory cells which store information as values of a threshold voltage, wherein each of said plurality of memory cells has a floating gate;

a command decoder decoding a command supplied thereto; and a control circuit controlling a specified operation according to a result of decoding by said command decoder;

wherein said control circuit controls execution of an injecting operation, an ejecting operation, a verify operation and a threshold voltage setting operation in accordance with a result of decoding of a command indicating a threshold voltage changing operation by said command decoder; in which (i) said injecting operation is for injecting electrons into the floating gates to set the threshold voltage of the memory cells in a first positive voltage region;

(ii) said ejecting operation is for ejecting electrons from the floating gates of selected memory cells;

(iii) said verify operation is for verifying whether a threshold voltage of each of said selected memory cells is set into a predetermined range which is higher than 0V and which is lower than a second positive voltage; and (iv) said threshold voltage setting operation is for setting only a threshold voltage of outside of said predetermined range into said predetermined range when a memory cell having a threshold voltage of said outside of said predetermined range is verified in said verify operation.

36. The nonvolatile memory device according to claim 35, wherein each of said plurality of memory cells further has a control gate, a first semiconductor region and a second semiconductor region.

37. The nonvolatile memory device according to claim 35, further comprising a voltage generator circuit generating a first voltage and a second voltage, on the basis of a power supply voltage applied thereto, during a verify operation associated with said ejecting operation and with said threshold voltage setting operation.

38. The nonvolatile memory device according to claim 37, further comprising a plurality of word lines each of which is coupled to the control gate of corresponding memory cells, and said first and second voltages are applied to the word line coupled with selected memory cells.

39. The nonvolatile memory device according to claim 38, wherein a difference between an internal voltage to be applied to the control gate of a selected memory cell and an internal voltage to be applied to said first semiconductor region of that memory cell in a first, said ejecting operation is larger than a difference between an internal voltage to be applied to the control gate and an internal voltage to be applied to said first semiconductor region of said memory cell in a second ejecting operation, associated with said threshold voltage setting operation.

40. The nonvolatile memory device according to claim 39, wherein said first semiconductor region is a source region.

41. The nonvolatile memory device according to claim 40, wherein electrons in each of said floating gates are ejected therefrom to the source regions of each of the selected memory cells in said first and second ejecting operations.

42. The nonvolatile memory device according to claim 39, wherein said first semiconductor region is a drain region.

43. The nonvolatile memory device according to claim 42, wherein electrons in each of said floating gates are ejected therefrom to the drain regions of each of the selected memory cells in said first and second ejecting operations.

44. The nonvolatile memory device according to claim 38, wherein a time in which internal voltages are applied to said control gate and to one of said first and second semiconductor regions in a first, said ejecting operation is different from a time in which internal voltages are applied to said control gate and to the said one of said first and second semiconductor regions in a second ejecting operation, associated with said threshold voltage setting operation, of selected memory cells.

45. The nonvolatile memory device according to claim 41, wherein each of said plurality of memory cells consists essentially of a single transistor which comprises:
semiconductor body;
said first semiconductor region, constituting the source region, and said second semiconductor region which are formed in said semiconductor body;
a first insulating film covering at least a channel forming region between said first and second semiconductor regions at a surface of said semiconductor body;
said floating gate covering said first insulating film at least between said first and second semiconductor regions;
a second insulating film covering said floating gate at least between said first and second semiconductor regions; and
said control gate, covering said second insulating film at least between said first and second semiconductor regions.

46. The nonvolatile memory device according to claim 45, wherein the memory device is a single chip nonvolatile semiconductor device.

47. The nonvolatile memory device according to claim 43, wherein each of said plurality of memory cells consists essentially of a single transistor which comprises:
a semiconductor body;
said first semiconductor region, constituting said drain region, and said second semiconductor region which are formed in said semiconductor body;
a first insulating film covering at least a channel forming region between said first and second semiconductor regions at a surface of said semiconductor body;
said floating gate covering said first insulating film at least between said first and second semiconductor regions;
a second insulating film covering said floating gate at least between said first and second semiconductor regions; and
said control gate covering said second insulating film at least between said first and second semiconductor regions.

48. The nonvolatile memory device according to claim 47, wherein the memory device is a single chip nonvolatile semiconductor device.

49. The nonvolatile memory device according to claim 42,
wherein each of said plurality of memory cells consists essentially of a single transistor which comprises:
a semiconductor body;
said first semiconductor region, constituting the drain region, and said second semiconductor region which are formed in said semiconductor body;
a first insulating film covering at least a channel forming region between said first and second semiconductor regions at a surface of the semiconductor body;
said floating gate covering said first insulating film at least between said first and second semiconductor regions;
a second insulating film covering said floating gate at least between said first and second semiconductor regions; and
said control gate covering said second insulating film at least between said first and second semiconductor regions.

50. The nonvolatile memory device according to claim 49, wherein the memory device is a single chip nonvolatile semiconductor device.

* * * * *